United States Patent
Shimizu et al.

[11] Patent Number: 6,115,287
[45] Date of Patent: Sep. 5, 2000

[54] NONVOLATILE SEMICONDUCTOR MEMORY DEVICE USING SOI

[75] Inventors: Kazuhiro Shimizu; Seiichi Aritome, both of Yokohama, Japan

[73] Assignee: Kabushiki Kaisha Toshiba, Kawasaki, Japan

[21] Appl. No.: 09/200,129

[22] Filed: Nov. 25, 1998

[30] Foreign Application Priority Data

Nov. 27, 1997 [JP] Japan ..................... 9-325945

[51] Int. Cl.[7] .................................. G11C 16/04
[52] U.S. Cl. ...................... 365/185.17; 365/185.18; 365/185.24
[58] Field of Search ............. 365/185.17, 185.18, 365/185.24

[56] References Cited

U.S. PATENT DOCUMENTS

| | | | |
|---|---|---|---|
| 5,706,228 | 1/1998 | Chang et al. | 365/185.18 |
| 5,784,325 | 7/1998 | Arase et al. | 365/185.18 |
| 5,889,699 | 3/1999 | Takano | 365/185.18 |

FOREIGN PATENT DOCUMENTS 06326277  11/1994  Japan.

*Primary Examiner*—Son T. Dinh
*Attorney, Agent, or Firm*—Hogan & Hartson, LLP

[57] ABSTRACT

A NAND type EEPROM according to the present invention is formed on an SOI substrate as follows. Silicon thin films (element regions) isolated in a grid pattern are formed on an insulation layer on a silicon substrate. A trench between the silicon thin films is filled with insulating material. Thus, the elements in the row direction are isolated completely by the insulating material. A silicon thin film on which a memory cell is formed, contains a very small amount of n-type impurities and is close to an intrinsic semiconductor. A silicon thin film on which a select gate transistor is formed is of a p-type. The source and drain diffusion layers of the memory cell and select gate transistor are of an n-type. The channel of each of memory cells constituting a NAND string is constituted of at least two regions having different threshold voltages.

16 Claims, 20 Drawing Sheets

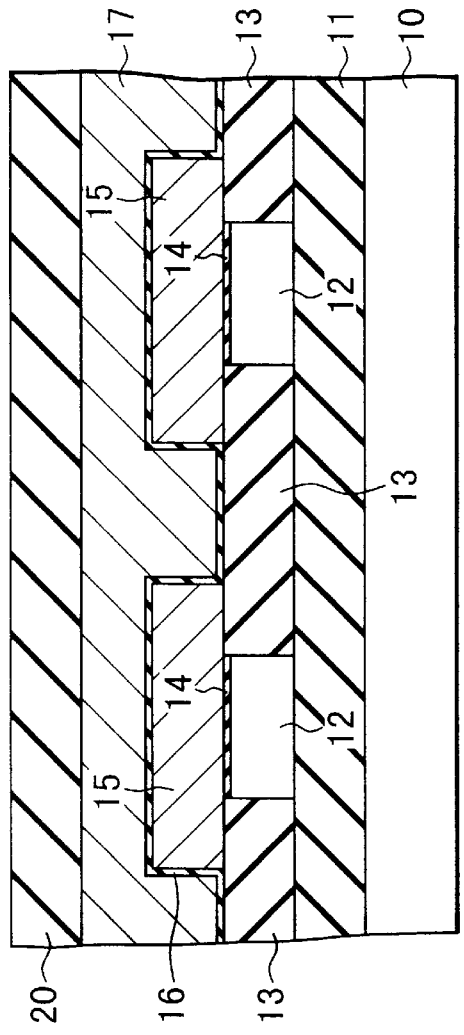
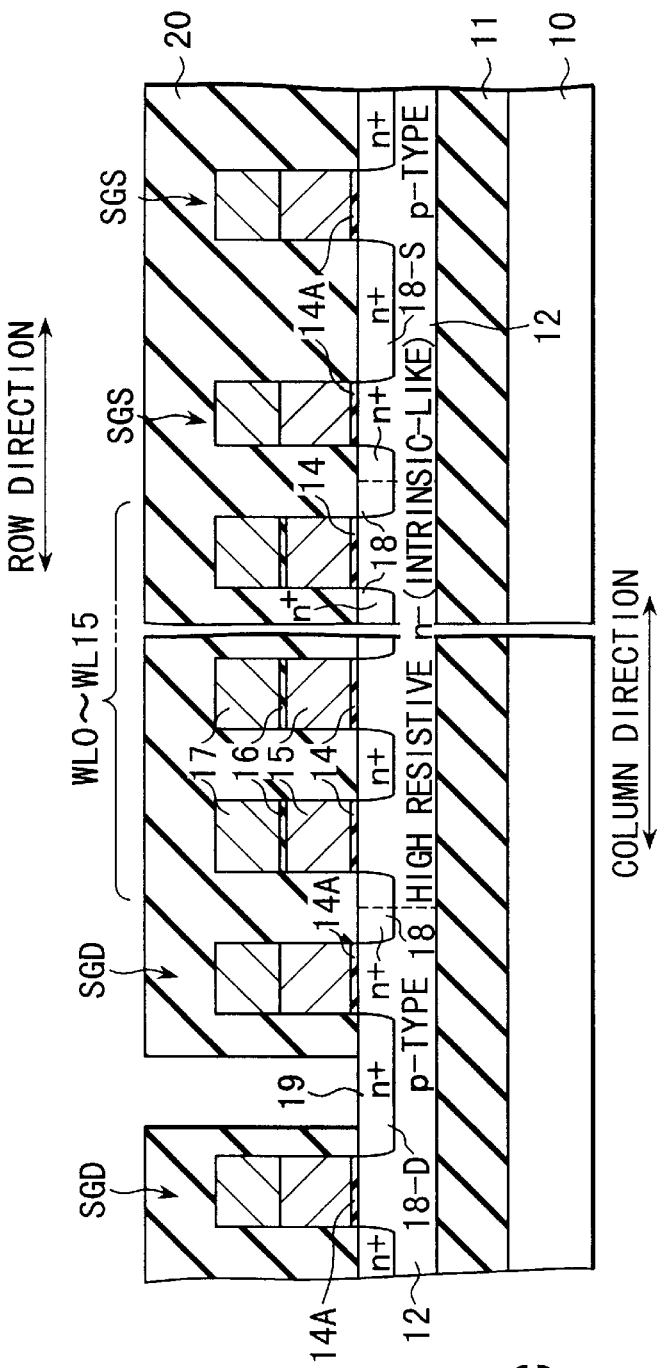
FIG. 4B
FIG. 4C

| MODE LINE | ERASE | WRITE | READ |
|---|---|---|---|
| BL1 | 0V | 0V | 1V |
| BL2 | 0V | 0V | 1V |
| SGD | 0V | 0V | 3V |
| WL0 | -20V | 0V | 3V |
| WL1 | -20V | 20V | 0V |
| ⋮ | | | |
| WL15 | -20V | 0V | 3V |
| SGS | 0V | 0V | 3V |
| SL | 0V | 0V | 0V |
| GL1 | 1V | 1V | 0V |
| GL2 | 1V | 0V | 0V |

NONVOLATILE SEMICONDUCTOR MEMORY DEVICE USING SOI

BACKGROUND OF THE INVENTION

The present invention relates to a nonvolatile semiconductor memory device using SOI (silicon on insulator) and, in particular, to miniaturization and high performance of a nonvolatile semiconductor memory device.

An EEPROM (electrically erasable and programmable ROM), which is one of nonvolatile semiconductor memory devices, will be described hereinafter. It is known that the EEPROM utilizes memory cells each having a MOS transistor structure of a layered structure of a floating gate (charge storing layer) and a control gate.

FIGS. 1A and 1B are cross-sectional views of a memory cell used for an EEPROM having a MOS transistor structure of a floating gate and a control gate.

As illustrated in FIG. 1A, an element isolation insulation film 102 is formed in an element isolation region on a silicon semiconductor substrate 101. A $p^+$ diffusion layer 103, serving as a channel stopper, is formed immediately under the film 102. A thin gate insulation film 104 through which a tunnel current is allowed to flow, is formed in an active region of the substrate 101. A floating gate electrode (charge storing layer) 105 is formed on the film 104, and a control gate 107 is formed on the electrode 105 with an insulation film 106 interposed therebetween. As shown in FIG. 1B, an $n^+$ diffusion layer 108 serving as a source or a drain of the memory cell, is formed in self-alignment by ion implantation using the floating gate electrode 105 and control gate 107 as a mask.

Conventionally, a field oxide film, which is formed by thermal oxidation of the silicon semiconductor substrate 101, is used for the element isolation insulation film 102. LOCOS (Local Oxidation of Silicon) is well knows as a method for forming the field oxide film. In the LOCOS, using a silicon nitride film formed on the silicon semiconductor substrate as a mask, a thick silicon oxide film (element isolation insulation film) is formed by thermal oxidation in a region which is not covered with the silicon nitride film.

However, when the element isolation insulation film (field oxide film) 102 is formed by the LOCOS, a wedged portion called a bird's beak is formed in the film 102. It is well known that the bird's beak makes the dimensions of the actually-formed element isolation insulation film 102 greater than those of a design for the element isolation region. Therefore, in general, the LOCOS is not suitable for forming a very small element isolation region of 0.5 µm or less.

According to the LOCOS, since almost lower half of the element isolation insulation film 102 extends to the inside of the silicon semiconductor substrate 1 from the surface thereof, the element isolation ability is very poor. In this respect, too, in LOCOS, it is very difficult to narrow an interval between isolated elements.

Furthermore, according to the LOCOS, part of the element isolation insulation film 102, which protrudes from the surface of the silicon substrate 101, causes a step on the substrate 101. This step decreases a processing margin of a pattern having very small dimensions in a photolithographic process.

As an element isolation technique for resolving the above problems, a trench element isolation method (which is called "shallow trench isolation") is known in which a trench is formed in a silicon semiconductor substrate and filled with insulating materials.

FIG. 2 is a cross-sectional view of a memory cell of a nonvolatile semiconductor memory device adopting the trench element isolation method.

The trench element isolation method has the following advantages. Since the actual dimensions are almost equal to those of a design, the method is more suitable for forming a miniaturized element isolation region than the LOCOS. Since almost all the element isolation insulation film 102 is formed inside the silicon semiconductor substrate 101, the method is excellent in element isolation ability. since, furthermore, the surface of the element isolation insulation film 102 is flat and almost flush with that of the silicon semiconductor substrate 101, the film 102 does not cause a step on the substrate 101.

In the memory cell shown in FIG. 2, the element isolation insulation film 102 is formed in selfalignment with a floating gate electrode (charge storing layer) 105; therefore, the floating gate electrode 105 has no portion (wing portion) overlapping the film 102. The width of the film 102 thus depends upon only the element isolation characteristics.

However, even in the trench element isolation method, the element isolation ability depends upon an interval between adjacent elements (memory cells) or the width of the element isolation insulation film 102 (width of the trench) and the depth thereof (depth of the trench). If the width of the film 102 is decreased, the depth thereof has to be increased in order to achieve an adequate element isolation ability. This means that the aspect ratio of the trench is increased; thus, it is very difficult to achieve a process of etching for forming the trench and that of burying insulating materials into the trench.

Let us consider the performance of a transistor constituting a memory cell. The planar technique of forming an element by thermally oxidizing the surface of a silicon substrate and exposing the surface of an element region, is remarkably effective in increasing the size of an integrated circuit and the packing density thereof. However, as the miniaturization and integration of semiconductor elements increase to gain their operation speed, the influence of parasitic capacitance between the silicon semiconductor substrate and the metal wiring between the elements has recently become so great.

The product of a voltage applied to the semiconductor elements, power consumption due to a current caused to flow by the voltage, and delay time of the semiconductor elements, is fixed as a CR time constant of parasitic capacitance C and parasitic resistance R. Therefore, the parasitic capacitance C and parasitic resistance R have to be decreased in order to perform a high-speed operation while lowering the power consumption.

The wiring resistance, contact resistance, element resistance, etc., which cause the parasitic resistance R, are greatly reduced by improvement in process. On the other hand, the parasitic capacitance C is a very serious problem because it increases more greatly as an interval between the elements becomes narrower and narrower. Since, for example, the capacitance between wirings is abruptly. increased by miniaturization, a space between layers needs to be filled with low-dielectric insulative materials. Since, however, the elements are formed on the silicon semiconductor substrate, the parasitic capacitance between the substrate and wiring cannot be eliminated.

In the conventional nonvolatile semiconductor memory device described above, it is very difficult to form an element isolation insulation film having an adequate element isolation characteristic by increasing the size and packed density of an element, and the parasitic resistance and parasitic capacitance of the element are increased.

BRIEF SUMMARY OF THE INVENTION

An object of the present invention is to provide a nonvolatile semiconductor memory device which is improved in element isolation and reduced in parasitic resistance and parasitic capacitance and which is capable of miniaturization and high-degree of integration.

In order to attain the above object, according to a first aspect of the present invention, there is provided a nonvolatile semiconductor memory device comprising a semiconductor layer formed on an insulation layer and isolated by an element isolation insulation layer, a NAND string having a charge storing layer and constituted of a plurality of memory cell transistors formed on the semiconductor layer and connected in series, a bit line connected to a drain side of the NAND string, and a source line connected to a source side of the NAND string, wherein a first potential is applied to at least one of the bit line and the source line, and one of a second potential, which is higher than the first potential, and a third potential, which is lower than the first potential, is applied to a control gate electrode of each of the memory cell transistors, thereby to transfer charges between a channel of each of the memory cell transistors and the charge storing layer.

In the nonvolatile semiconductor memory device, the channel of each of the memory cell transistors is constituted of at least two regions having different threshold voltages in a gate length direction, one of the regions having a highest threshold voltage being arranged closer to the source side than another of the regions having a lowest threshold voltage.

In the nonvolatile semiconductor memory device so constituted, the element regions (active regions) are formed and isolated on the insulation layer, a trench between the element regions is filled with insulating material. Since the elements are isolated completely by the insulating material, the interval between the elements can be set to a possible minimum value by the lithographic process. Thus, the element isolation is improved, and the parasitic resistance and parasitic capacitance can be reduced, and miniaturization and high degree of integration can be achieved. Furthermore, in this device, a channel of each of memory cell transistors constituting a NAND string includes at least two impurity concentration regions having different threshold voltages. Therefore, data can be erased at once for each block which is a unit of erasure.

According to a second aspect of the present invention, there is provided a nonvolatile semiconductor memory device comprising a semiconductor layer formed on an insulation layer and isolated by an element isolation insulation layer, and a memory cell transistor formed on the semiconductor layer and having a charge storing layer, wherein an amount of cell current flowing between a source diffusion layer and a drain diffusion layer of the memory cell transistor when a gate voltage applied to a gate electrode of the memory cell transistor, falls within a first voltage region which is higher than a reference voltage and not lower than a predetermined voltage and a second voltage region which is lower than the reference voltage and not higher than a predetermined voltage, is $10^4$ times or more as large as that of cell current flowing when the gate voltage corresponds to the reference voltage.

In the nonvolatile semiconductor memory device, a conductivity type of each of the drain diffusion layer and the source diffusion layer of the memory cell transistor is identical with that of the semiconductor layer.

In the nonvolatile semiconductor memory device so constituted, the element regions (active regions) are formed and isolated on the insulation layer, a trench between the element regions is filled with insulating material. Since the elements are isolated completely by the insulating material, the interval between the elements can be set to a possible minimum value by the lithographic process. Thus, the element isolation is improved, and the parasitic resistance and parasitic capacitance can be reduced, and miniaturization and high degree of integration can be achieved. Furthermore, in this device, the conductivity type of the drain and source diffusion layers of each of the memory cell transistors is the same as that of the semiconductor layer on which the memory cell transistor is formed. Therefore, data can be erased at once for each block which is a unit of erasure.

According to a third aspect of the present invention, there is provided a nonvolatile semiconductor memory device comprising a semiconductor layer formed on an insulation layer and isolated by an element isolation insulation layer, NAND strings each having a charge storing layer and constituted of a plurality of memory cell transistors formed on the semiconductor layer and connected in series, and an electrode formed on a second surface of the semiconductor layer with an insulation film interposed therebetween, the second surface being opposite to a first surface of the semiconductor layer, and the first surface facing a control gate electrode of each of the memory cell transistors and serving as a channel thereof.

In the nonvolatile semiconductor memory device so constituted, the element regions (active regions) are formed and isolated on the insulation layer, a trench between the element regions is filled with insulating material. Since the elements are isolated completely by the insulating material, the interval between the elements can be set to a possible minimum value by the lithographic process. Thus, the element isolation is improved, and the parasitic resistance and parasitic capacitance can be reduced, and miniaturization and high degree of integration can be achieved.

Furthermore, in this device, an insulation film is formed on the surface of the active region (silicon layer) which is opposite to the other surface thereof on which the charge storing layer of the memory cell is formed, and an electrode is formed on the insulation film. Since, therefore, a channel can be formed in the interface of the active region, the potential of the bit line can be transferred to the channels of all the memory cells in a block which is a unit of erasure. Consequently, data can be erased at once for each block which is a unit of erasure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4B is a cross-sectional view taken along line 4B—4B of FIG. 4A;

FIG. 4C is a cross-sectional view taken along line 4C—4C of FIG. 4A;

DETAILED DESCRIPTION OF THE INVENTION

Referring to the accompanying drawings, a NAND type flash EEPROM will now be described in detail as a nonvolatile semiconductor memory device of the present invention.

Figure 1A:
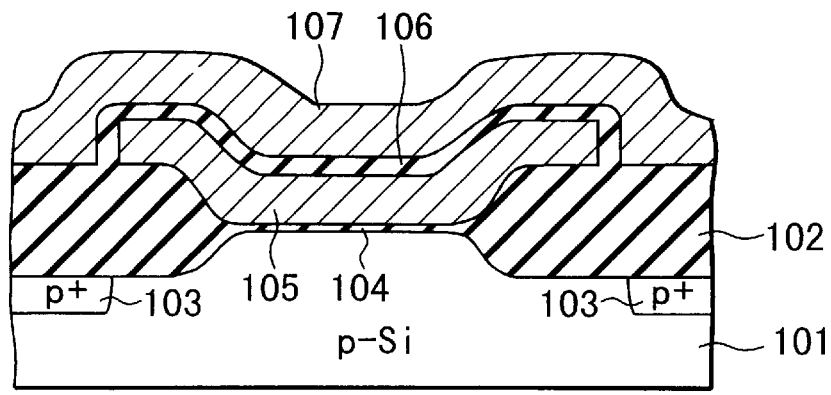
FIG. 1A is a cross-sectional view of a memory cell used in an EEPROM having a MOS transistor structure having a layered structure of a floating gate and a control gate.
Figure 1B:
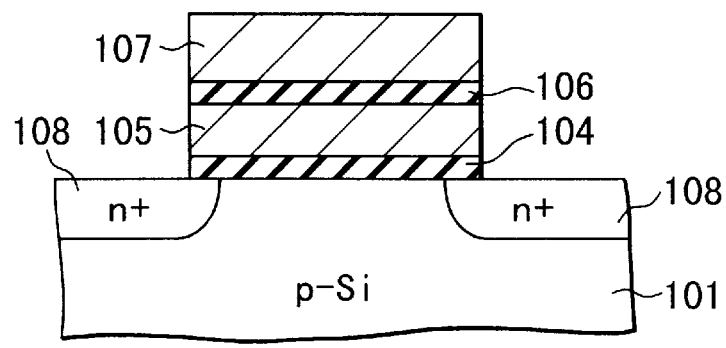
FIG. 1B is a cross-sectional view of the memory cell which crosses the cross-sectional view shown in FIG. 1A.
Figure 2:
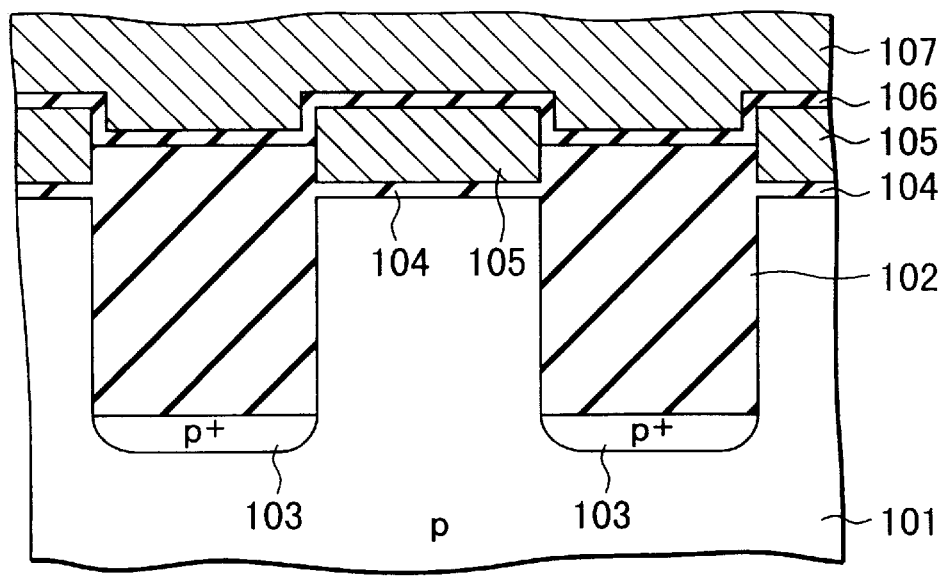
FIG. 2 is a cross-sectional view of a memory cell of a nonvolatile semiconductor memory device adopting a trench element isolation method.
Figure 3A:
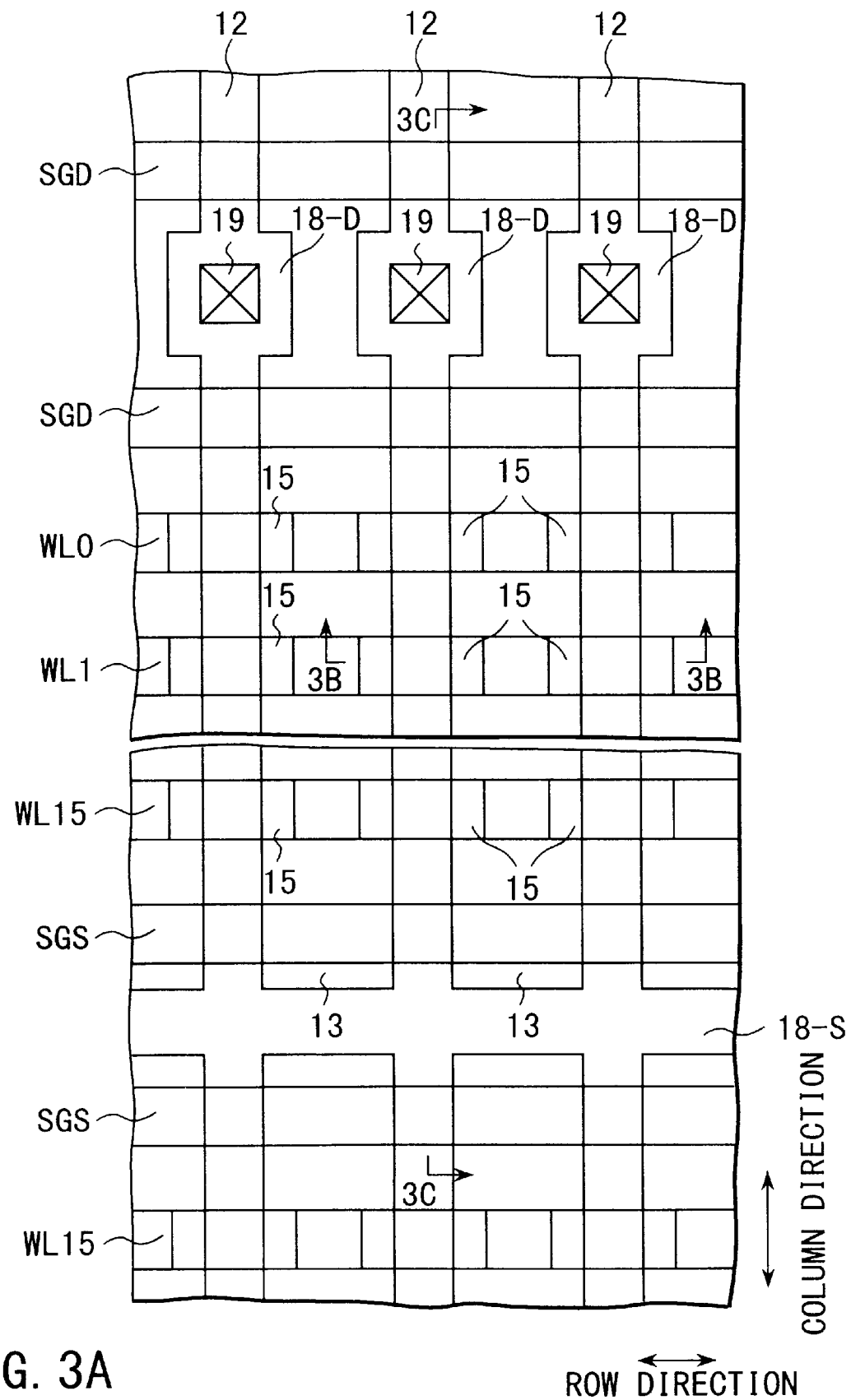
FIG. 3A is a layout view of a NAND type flash EEPROM according to a first embodiment of the present invention.
Figure 3B:
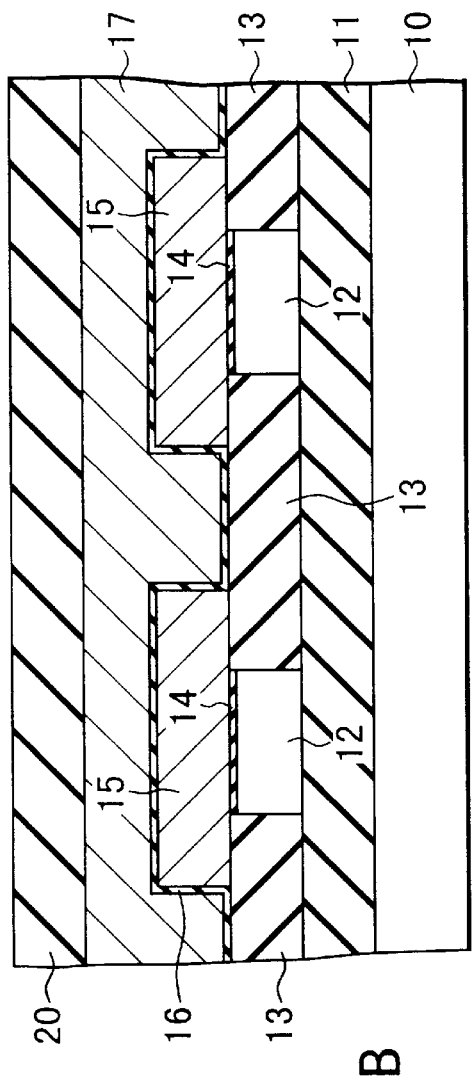
FIG. 3B is a cross-sectional view taken along line 3B—3B of FIG. 3A.

FIG. 3A is a layout plan view of a NAND type flash EEPROM according to a first embodiment of the present invention. FIG. 3B is a cross-sectional view taken along line 3B—3B of FIG. 3A, and FIG. 3C is a cross-sectional view taken along line 3C—3C of FIG. 3A.

Figure 3C:
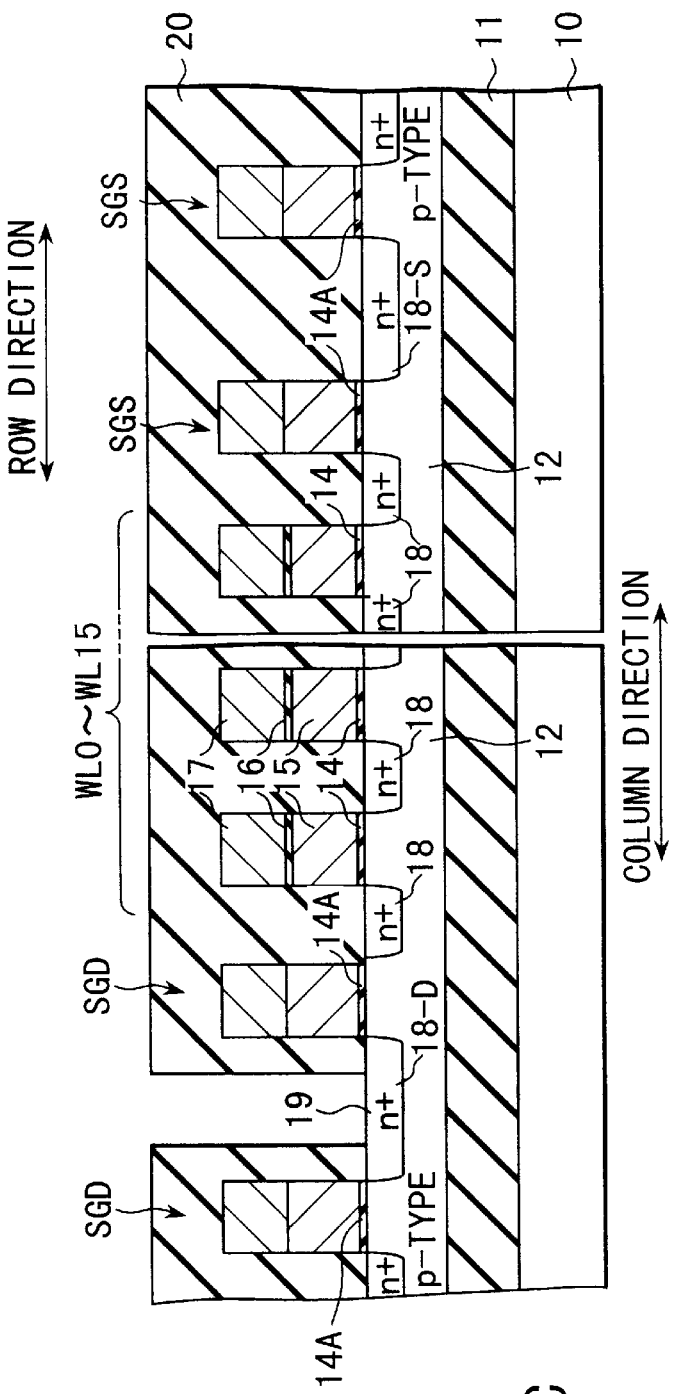
FIG. 3C is a cross-sectional view taken along line 3C—3C of FIG. 3A.

The NAND type flash EEPROM is constituted as illustrated in FIGS. 3A to 3C. An insulation layer 11 is formed on a silicon semiconductor substrate 10, and silicon thin films 12 are formed on the insulation layer 11. The layer 11 is obtained by thermal oxidation of the substrate 10 or ion-implantation of oxygen into the substrate 10. The films 12 are obtained by single-crystallization of amorphous silicon or polysilicon. The technique of forming the silicon thin films 12 on the insulation layer 11 is called SOI (silicon on insulator).

The silicon thin films 12 are formed in a grid pattern on the insulation layer 11 and each used as an active layer. A space between the silicon thin films 12 is filled with insulating material (e.g., silicon oxide film) 13 serving to isolate the elements.

In the first embodiment, after the silicon thin films 12 are formed by lithography, a space between the films 12 is filled with the insulating material 13, thereby to completely separate adjacent elements in the row direction. In principle, the width of the insulating material 13 (interval between the elements) in the row direction can be set to the minimum which depends upon the lithography and etching.

In the silicon thin films 12, p-type impurities are introduced. As illustrated in FIG. 3A, an n-type source diffusion layer 18-S is formed in those portions of the silicon thin films 12 which extend in the row direction, while an n-type drain diffusion layers 18-D are formed in those portions thereof which extend in the column direction. Between the source and drain diffusion layers 18-S and 18-D, a NAND string constituted of, e.g., 16 memory cell transistors and connected in series to serve as a cell unit, and two select gate transistors arranged at both ends thereof are formed.

As illustrated in FIG. 3C, each of the memory cell transistors is constituted of a gate insulation film (tunnel oxide film) 14, a floating gate electrode (charge storing layer) 15, an insulation film (e.g., an ONO film) 16, a control gate electrode 17, and an n-type diffusion layer 18. The gate insulation film 14 is formed on a channel region between n-type diffusion layers 18, and the floating gate electrode 15 is formed on the film 14. The insulation film 16 is formed on the electrode 15, and the control gate electrode 17 is formed on the film 16. The n-type diffusion layer 18, which serves as a source or a drain, is formed in the silicon thin film 12 between the control gate electrodes 17 of adjacent memory cells.

As shown in FIG. 3C, the select gate transistor, which is connected to the source diffusion layer 18-S, is constituted of a gate insulation film (e.g., a silicon oxide film) 14A, a gate electrode SGS, and an n-type diffusion layer 18. The gate insulation film 14A is formed on a channel between the n-type diffusion layers 18 and 18-S, and the gate electrode SGS is formed on the film 14A. The n-type diffusion layers 18 and 18-S each serving as a source or a drain, are formed in the silicon thin film 12 and on both sides of the gate electrode SGS.

As shown in FIG. 3C, the select gate transistor, which is connected to the drain diffusion layer 18-D, is constituted of a gate insulation film (e.g., a silicon oxide film) 14A, a gate electrode SGD, and an n-type diffusion layer 18. The gate insulation film 14A is formed on a channel between the n-type diffusion layers 18 and 18-D, and the gate electrode SGD is formed on the film 14A. The n-type diffusion layers 18 and 18-D each serving as a source or a drain, are formed in the silicon thin film 12 and on both sides of the gate electrode SGD.

In FIG. 3C, reference numeral 19 indicates a drain contact portion and 20 denotes an interlayer insulation film. A bit line (not shown) is connected to the drain contact portion 19, and a source wiring is connected to the source diffusion layer 18-S through a source contact portion (not shown).

The above NAND string and two select gate transistors are arranged in matrix to constitute a memory cell array.

The feature of the foregoing NAND type flash EEPROM lies in that the memory cell array is formed in the silicon thin film 12 of the substrate having an SOI structure. The film 12 is formed in a grid pattern, and a space between the silicon thin films 12 is filled with the insulating material 13 having an element isolating function. With this feature, adjacent memory cells in the row direction can completely be separated from each other and thus neither a punch-through withstand voltage nor a field inversion withstand voltage need to be considered. Therefore, in principle, the width of the insulating material 13 (an interval between elements) in the row direction can be set to the minimum which depends upon the lithographic and etching techniques.

Since the memory cells are formed on the insulation film 11, the parasitic capacitance of wiring such as a bit line is greatly reduced and thus the memories can be improved in performance. Since, moreover, thin-film elements such as transistors are formed on the insulation layer 11, three-dimensional integration of the thin films in which an insulation layer is formed on the thin-film element and a thin-film element is formed on a silicon thin film of the insulation layer, can be done in future.

In the foregoing NAND type flash EEPROM, the NAND strings are completely separated from each other by the insulation layer 11 having an SOI structure and the element isolating insulating material 13. In other words, a well common to the NAND strings cannot be formed in the silicon thin film 12.

The threshold voltage of a memory cell can be varied by electric charges transferred between the floating gate electrode and active region (channel). If a positive high voltage is applied to the control gate electrode to set the bit and source lines at 0V, an inverted electronic channel is formed in the active region; thus, electrons are injected from the inverted electronic channel into the floating gate to increase the threshold voltage of the memory cell.

To read data, a voltage of 0V is applied to the control gate electrode of a selected memory cell, and whether the threshold voltage of the memory cell is higher or lower than 0V depends upon whether a current flows or not through the memory cell. More specifically, if the threshold voltage is higher than 0V, the memory cell is not turned on and thus no channel current flows. On the other hand, if it is lower than 0V, the memory cell is turned on and thus a channel current flows. At this time, a positive potential for turning on the memory cell irrespective of data value, is applied to the control gate electrode of a non-selected memory cell in such a manner that a channel current flows even when the threshold voltage is high.

However, in the NAND type flash EEPROM using an SOI substrate, which performs the above operation, it is difficult to extract electrons from the floating gate and inject them into the active layer to make the threshold voltage not higher than 0V.

If a negative high voltage is applied to the control gate electrode to set the bit and source lines at 0V, holes are stored on the active region surface of the memory cell. Since, however, a PN junction formed of both the active region and diffusion region blocks the holes flowing into and from the diffusion layer, the potentials of the bit and source lines cannot be transferred to the active region of the memory cell.

More specifically, when a negative high voltage is applied to word lines WL0 to WL15 of all memory cell transistors constituting the NAND strings, the potentials of the bit and source lines become negative by capacitance coupling of the control gate electrode and the active region in a floating state in a memory cell to which the potentials of the bit and source lines are not transferred, and no electrons cannot be extracted from the floating gate electrode since no high electric field is applied between the floating gate and the control gate electrode, and thus the electrons cannot be extracted from the floating gate.

In the NAND type flash EEPROM having an SOI substrate as shown in FIGS. 1A to 3C, a positive voltage capable of transferring a potential applied to the bit or source line, such as 0V, needs to be applied to the word line of a memory cell transistor provided on the bit or source line side of a memory cell transistor in which data is erased, thereby to sequentially erase data for each memory cell transistor in the NAND string. The EEPROM of the first embodiment has a problem that such data erasure is required and a block global erasure for globally extracting electrons from the floating gates of all memory cell transistors of the NAND string cannot be executed.

A NAND type flash EEPROM according to a second embodiment of the present invention, which is capable of resolving the above problem of the first embodiment, will now be described.

Figure 4A:
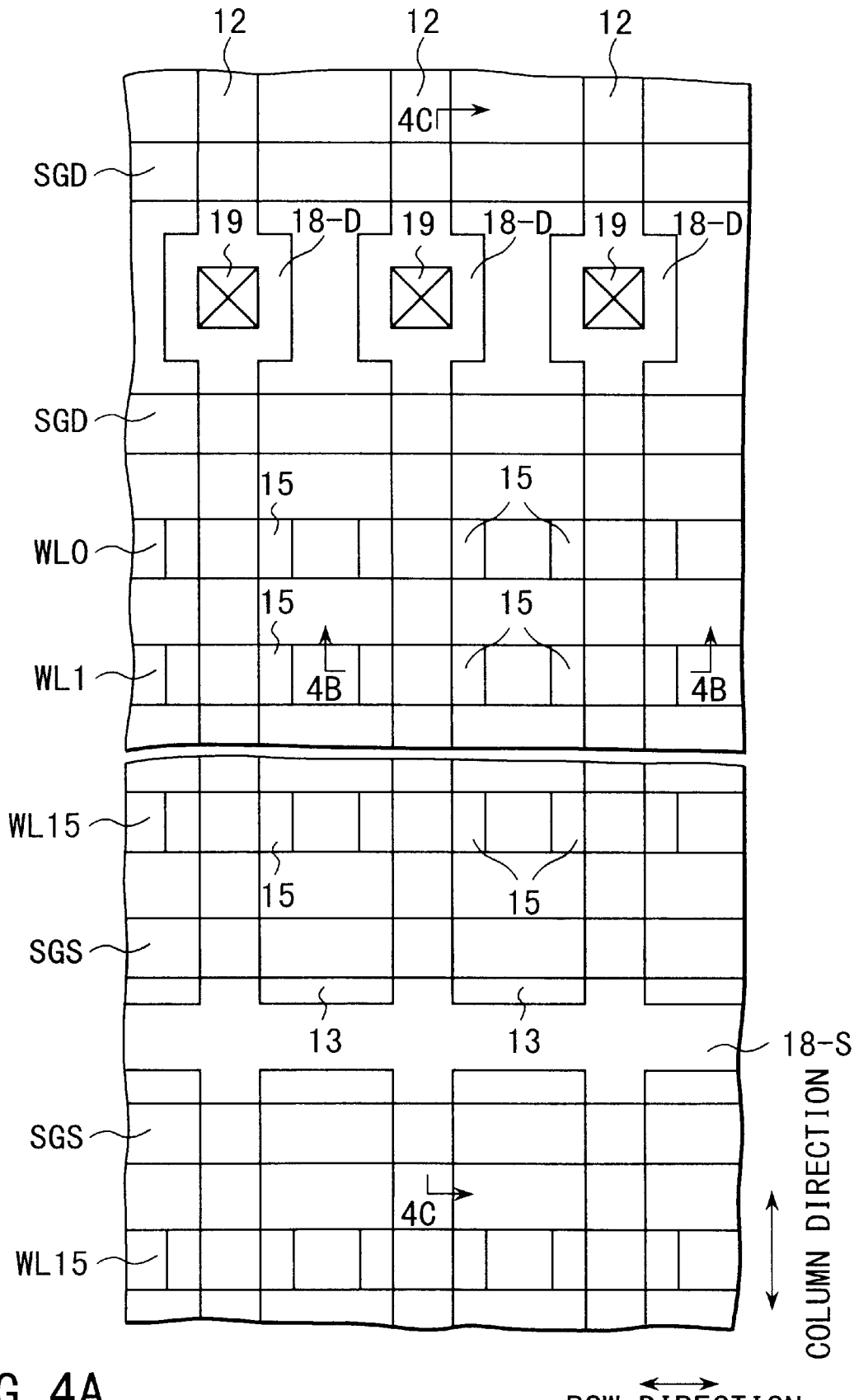
FIG. 4A is a layout view of a NAND type flash EEPROM according to a first embodiment of the present invention.

FIG. 4A is a layout plan view of the NAND type flash EEPROM of the second embodiment of the present invention. FIG. 4B is a cross-sectional view taken along line 4B—4B of FIG. 4A, and FIG. 4C is a cross-sectional view taken along line 4C—4C of FIG. 4A.

The NAND type flash EEPROM is constituted as illustrated in FIGS. 4A to 4C. An insulation layer 11 is formed on a silicon semiconductor substrate 10, and silicon thin films 12 are formed on the insulation layer 11. The layer 11 is obtained by thermal oxidation of the substrate 10 or ion-implantation of oxygen into the substrate 10. The films 12 are obtained by single-crystallization of amorphous silicon or polysilicon. The technique of forming the silicon thin films 12 on the insulation layer 11 is called SOI (silicon on insulator).

The silicon thin films 12 are formed in a grid pattern on the insulation layer 11 and each used as an active layer. A space between the silicon thin films 12 is filled with insulating material (e.g., silicon oxide film) 13 serving to isolate the elements.

The impurities introduced into the silicon thin films 12 in the second embodiment are partly different from those in the first embodiment. As shown in FIG. 4C, p-type impurities are introduced into that portion of the silicon thin films 12 where a select gate transistor is formed, while a very small quantity of n-type impurities are introduced into the portion thereof where a NAND string (including 16 memory cell transistors connected in series) is formed. The latter portion is high in resistance and close to an intrinsic semiconductor. The active layer where the memory cell transistors are formed has impurity concentration of $1 \times 10^{12}$ cm$^{-3}$ or lower and resistivity of $1 \times 10^5$ $\Omega$cm or higher. Since the other portions of the second embodiment are the same as those in the first embodiment, their descriptions are omitted.

An operation of the NAND type flash EEPROM of the second embodiment of the present invention, will now be described.

Figures 5A, 5B:
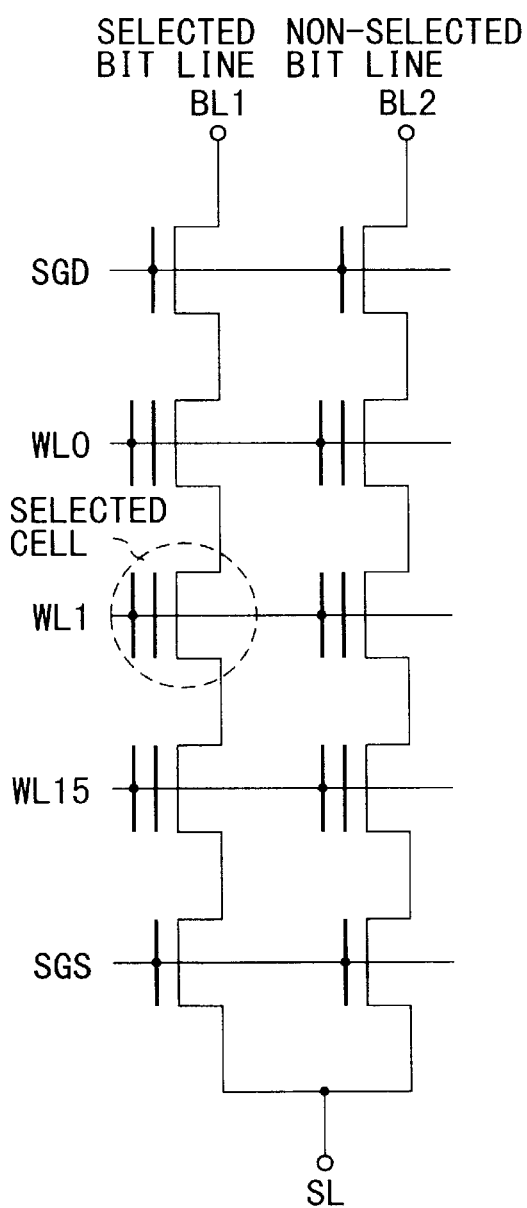
FIG. 5A is a circuit diagram of a NAND string and a select gate transistor constituting a NAND type flash EEPROM according to the second embodiment of the present invention.
FIG. 5B is a diagram showing a relationship in potential in the erase, write and read modes of the NAND type flash EEPROM according to the second embodiment of the present invention.

FIG. 5A is a circuit diagram of a NAND string and a select gate transistor constituting the NAND type flash EEPROM.

FIG. 5B is a diagram showing the relationship in potential in the erase, write and read modes of the EEPROM.

In the block batch erasure, the following voltages are applied to the respective lines. A low voltage (e.g., reference potential 0V) is applied to bit lines BL1, BL2, . . . and source line SL in a block. An intermediate voltage (e.g., 4V) is applied to gate electrodes SGD and SGS of the select gate transistor such that they are turned on. A negative high voltage (e.g., −18V) is applied to all of word lines WL0 to WL15 of the memory cells.

Then, a high electric field is applied between the active region (channel) and floating gate electrode (charge storing layer) to move electrons from the floating gate electrode to the active region via the gate insulation film. As a result, the threshold voltage of the memory cells in the block becomes lower than the reference voltage (e.g., 0V).

In the selective write mode, the following voltages are applied to the respective lines. A voltage of 0V is applied to the selected bit line BL1, and a write inhibit voltage (e.g., 8V) is applied to the non-selected bit line BL2. A positive high voltage (e.g., 18V) is applied to the selected word line WL1. A voltage (e.g., 10V) for transferring the write inhibit voltage is applied to the non-selected word lines WL0 and WL2 to WL15 other than the selected word line WL1, and the gate electrode SGD of the select gate transistor on the drain side. This voltage is set higher than the write inhibit voltage by the threshold voltage of the memory cell transistor and select gate transistor. A low voltage (e.g., 0V) is applied to the gate electrode SGS of the select gate transistor on the source to turn on the select gate transistor and thus to cut off the current flowing through the source line SL from the bit lines BL1, BL2. . . .

Since, therefore, a high electric field is applied between the active region and floating gate electrode (charge storing layer) formed under the selected word line WL1 to which a voltage of 0V is transferred from the selected bit line BL1, electrons are injected from the active region into the floating gate electrode through the gate insulation film. The threshold voltage of the selected memory cell becomes higher than the reference potential.

In the read mode, the following voltages are applied the respective lines. For example, a voltage of 1V is applied to the selected bit line BL1 and a voltage of 0V is applied to the non-selected bit line BL2. A low voltage (e.g., 0V) is applied to the selected word line WL1. An intermediate voltage (e.g., 4V) is applied to the non-selected word lines WL0 and WL2 to WL15 other than the selected word line WL1, and the gate electrodes SGD and SGS of the select gate transistors to turn on them.

If a selected cell is in an erase state,.current flows. If a selected cell is in an write state, no current flows and thus the threshold voltage of the memory cells cannot be determined.

In the NAND type flash EEPROM using an SOI substrate, the following two conditions should be satisfied in order to perform the foregoing erase operation, selective write and read operations:

1) First condition: In the batch erase mode, all the memory cell transistors are turned on and the low potential (0V) of the bit or source line is transferred to all the memory cells for execution of erasure. In the normal memory cells, however, the current is cut off when the voltage is not higher than the threshold voltage. If, therefore, a negative high voltage is applied to the gate electrodes of the memory cells, a low voltage (0V) of the bit or source line can be transferred to all the memory cells for execution of erasure.

2) Second condition: In the read mode, when a selected memory cell is in a write mode, the memory cells have to be reliably cut off by a low voltage (0V) applied to the control gate electrode. If, however, current flows through the memory cells by a leakage current, a sense amplifier recognizes that the selected memory cell is in an erase state.

Figure 6A:
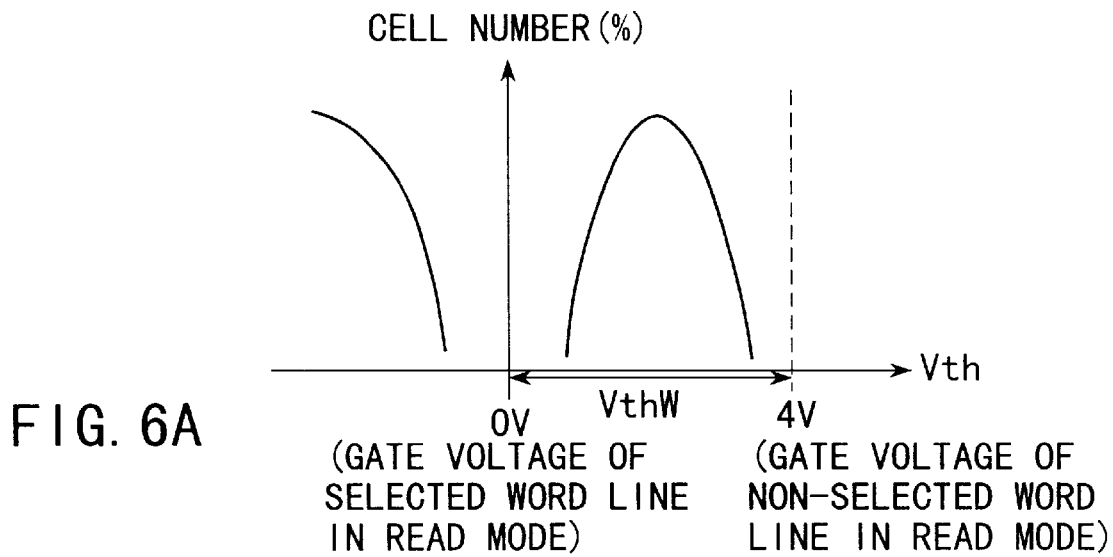
FIGS. 6A to 6C are graphs of the characteristics of a transistor used in the NAND type flash EEPROM according to the second embodiment of the present invention.
Figure 6B:
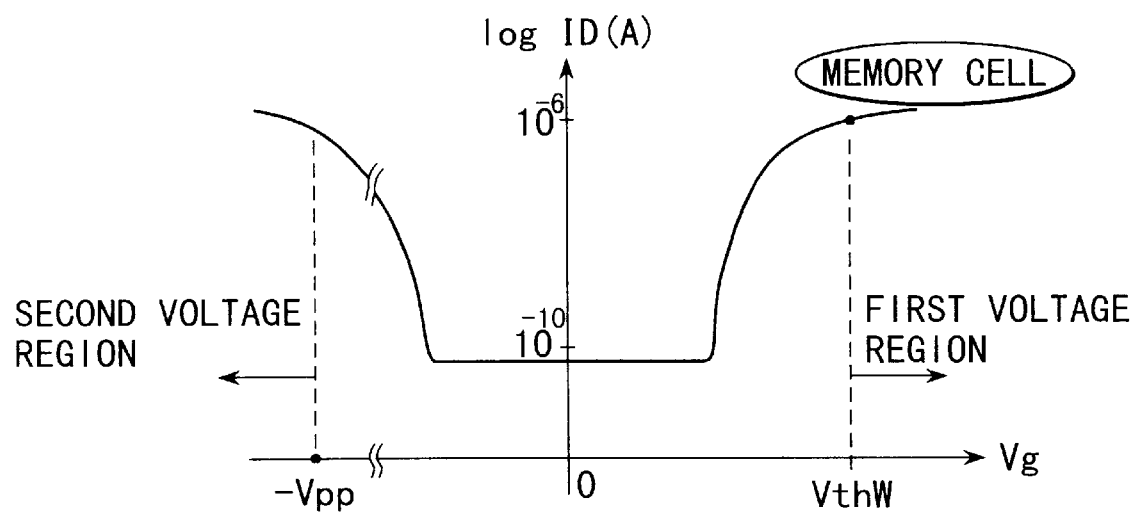
Figure 6C:
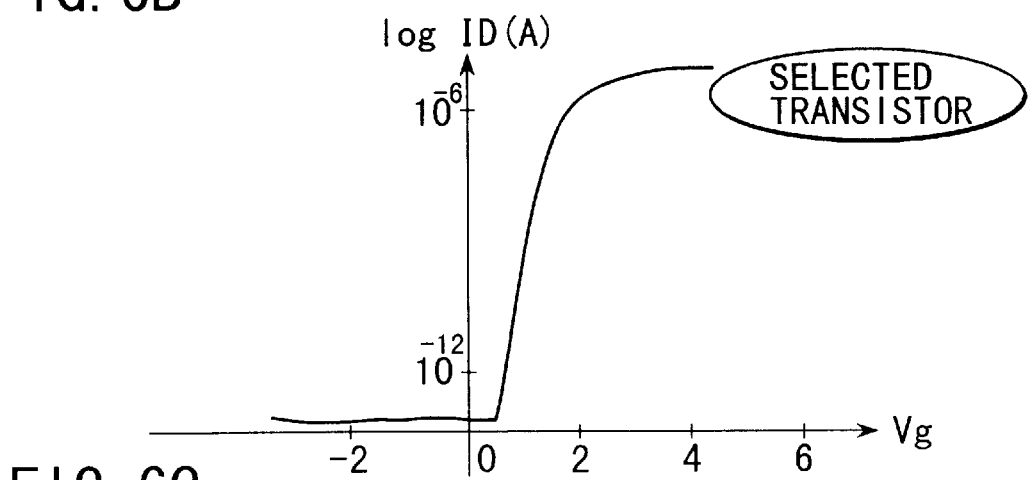

FIGS. 6A and 6B are graphs showing ideal characteristics of current-voltage characteristics of a memory cell transistor satisfying the above two conditions. FIG. 6C is also a graph showing current-voltage characteristics of a select gate transistor satisfying the above two conditions.

In the memory cell transistor, as shown in FIG. 6A, current flows between the source and drain when a positive voltage, which is not lower than the threshold voltage, is applied and when a negative high voltage, such as that applied in the erase mode, is applied, and current is cut off when a gate voltage, which is lower than the threshold voltage by a difference (about 4V) between the threshold voltage in the write mode and the voltage (about 0V) applied in the read mode.

In the memory cell array constituting a NAND type EEPROM, a potential difference between the source and drain occurs only in the read mode, and the voltage to e applied is very low and not higher than, e.g., 3V. If, furthermore, a gate voltage of 0V is applied to the memory cell in the erase state, the on/off ratio between the cell current (e.g., several amperes) flowing between the source and drain and the off current which can be recognized by the sense amplifier as a write state, is four digits or more.

Consequently, the above two conditions are satisfied if the on/off ratio is set to be four digits or more. In other words, the cell current in a region (first region in FIG. 6B) of the positive voltage applied to the non-selected word line to transfer the voltage of the bit line in the write mode and in a region (second region in FIG. 6B) of the negative voltage applied to the control gate electrode in the erase mode, has to be set to be about $10^4$ more than the cell current flowing when the reference voltage (e.g., 0V) is applied to the control gate of the memory cell.

In the select gate transistor, the bit line potential has to be transferred in all of the erase, write and read modes, and current should be cut off when a low voltage (0V) is applied to the gate of the select gate transistor on the source side in the write mode. In particular, the cut-off state should be considerably not higher than 1 pA in order to eliminate the through current flowing from the bit line to the source line and reduce the power consumption in a booster circuit. Thus, the select gate transistor should have the current-voltage characteristics as shown in FIG. 6C.

Figure 7:
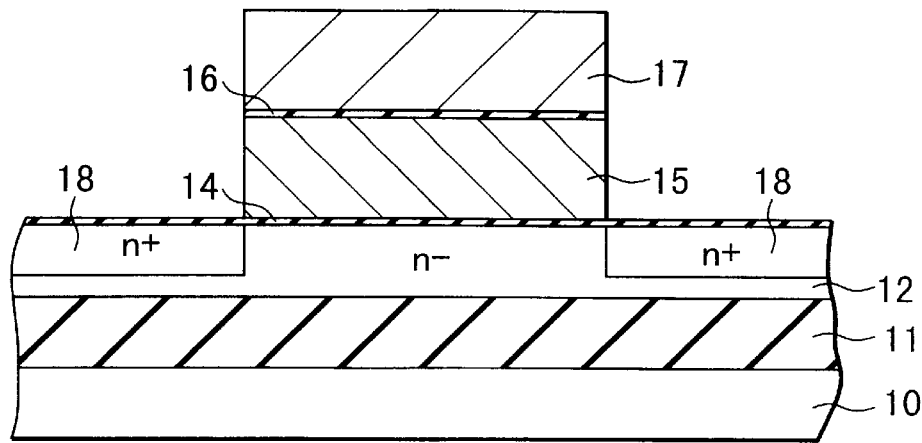
FIG. 7 is a cross-sectional view illustrating the structure of a memory cell transistor used in the NAND type flash EEPROM according to the second embodiment of the present invention.

FIG. 7 is a cross-sectional view illustrating the structure of a memory cell transistor which satisfies the foregoing first condition.

An insulation layer (silicon oxide film, etc.) 11 is formed on a silicon semiconductor substrate 10. A silicon thin film (active region) 12 is formed on the insulation layer 11. The film 12 is an n-type low-concentration impurity layer which is close to an intrinsic semiconductor and contains n-type impurities of, e.g., $1\times10^{12}$ cm$^{-3}$ or less. The resistivity of the silicon thin film 12 is therefore as high as $1\times10^5$ $\Omega$cm or more.

A gate insulation film (tunnel oxide film) 14 is formed on the silicon thin film 12, and a floating gate electrode (charge storing layer) 15 is formed on the film 14. An insulation film (ONO film, etc.) 16 is formed on the floating gate electrode 15, and a control gate electrode 17 is formed on the film 16. Moreover, n$^+$-type diffusion layers 18 serving as a source and a drain, are formed on both sides of the control gate electrode 17 in the silicon thin film 12.

Figure 8:
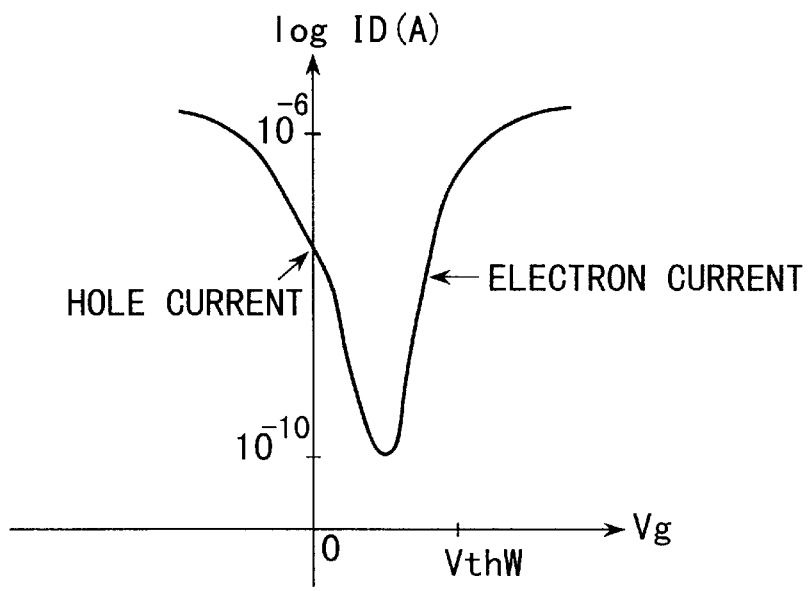
FIG. 8 is a graph of current-voltage characteristics when the memory cell transistor shown in FIG. 7 is in a write state.

FIG. 8 is a graph of current-voltage characteristics in the write state of a memory cell transistor having the structure shown in FIG. 7.

Assuming that a positive voltage, a voltage of 0V, and a positive voltage are applied to the control gate electrode 17, the source (one of n$^+$-type diffusion layers 18), and the drain (the other n$^+$-type diffusion layer 18), respectively, electrons are supplied from the source, and a storing electron layer is formed in an active region interface. Therefore, electron current flows between the source and drain of the memory cell transistor. Actually, the electron current is caused to flow even when the voltage is not higher than the threshold voltage.

If a negative voltage, a voltage of 0V, and a positive voltage are applied to the control gate electrode 17, the source (one of n$^+$-type diffusion layers 18), and the drain (the other n$^+$-type diffusion layer 18), respectively, electrons of electron/hole pairs caused by thermal energy, flows into the drain and the holes remain on the gate interface. The holes flow to the source side by the electric field between the source and drain. The n$^+$/n$^-$ junction between the n$^+$-type diffusion layer 18 and n$^-$-type silicon thin film 12 differs from the pn junction, and the blocking effect for the holes is very small. Thus, the holes are supplied from the drain side so as to compensate for those flowing to the source side and accordingly hole current flows. When the electron current and hole current are the smallest, the drain current is the minimum one; however, it varies with the drain voltage.

In the memory cell transistor having the structure shown in FIG. 7, since the potential at the bit line can be transferred by the hole current when a negative high voltage is applied to the control gate electrode, the block batch erase operation can be performed.

Though the block batch erase operation can be done, the off-state in the memory cell transistor is caused only in a very small gate voltage region; thus causing the problem that when a memory cell is in a write mode, the hole current flows at a gate voltage of 0V and cannot be cut off in the read mode.

Figure 9:
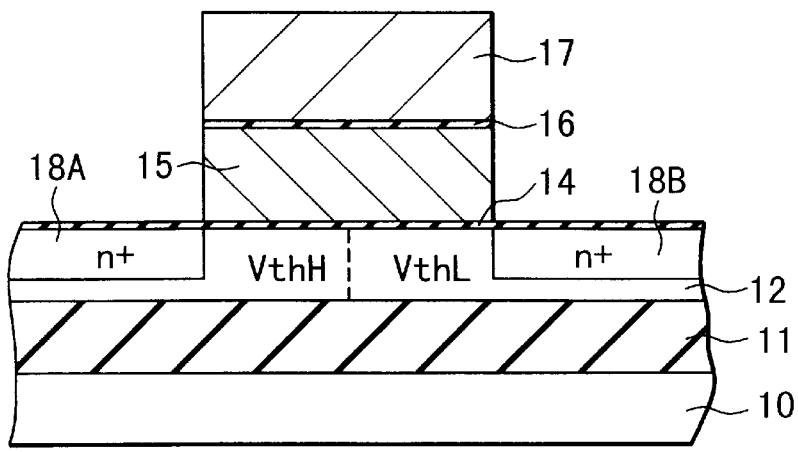
FIG. 9 is a cross-sectional view of the structure of another memory cell transistor used in the NAND type flash EEPROM according to the second embodiment of the present invention.

FIG. 9 is a cross-sectional view of the structure of a memory cell transistor by which the above problem can be resolved.

An insulation layer (silicon oxide film, etc.) 11 is formed on a silicon semiconductor substrate 10. A silicon thin film (active region) 12 is formed on the insulation layer 11. A gate insulation film (tunnel oxide film) 14 is formed on the silicon thin film 12, and a floating gate electrode (charge storing layer) 15 is formed on the film 14. An insulation film (ONO film, etc.) 16 is formed on the floating gate electrode 15, and a control gate electrode 17 is formed on the film 16. Moreover, an n$^+$-type diffusion layer 18A serving as a source and an n$^+$-type diffusion layer 18B serving as a drain are formed on both sides of the control gate electrode 17 in the silicon thin film 12.

The active region (channel) of the silicon thin film 12 formed between the source and drain of the memory cell transistor is divided into at least two regions having different threshold voltages. The active region having the lowest threshold voltage is arranged on the drain side, while the active region having the highest threshold voltage is arranged on the source side. The memory cell transistor in FIG. 9 is constituted of active regions having two threshold voltages VthL and VthH.

The electrical characteristics of a memory cell transistor having the structure shown in FIG. 9 will now be described.

Figure 10:
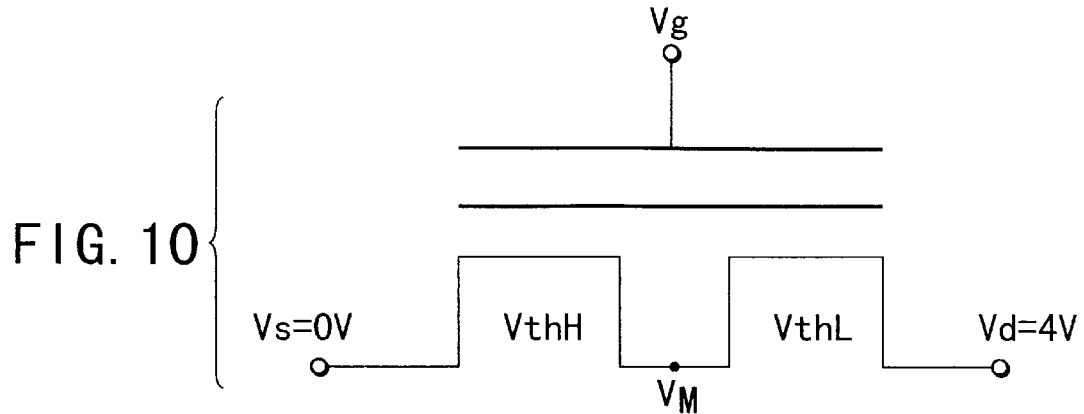
FIG. 10 is a simple equivalent circuit diagram of the memory cell transistor.
Figure 11:
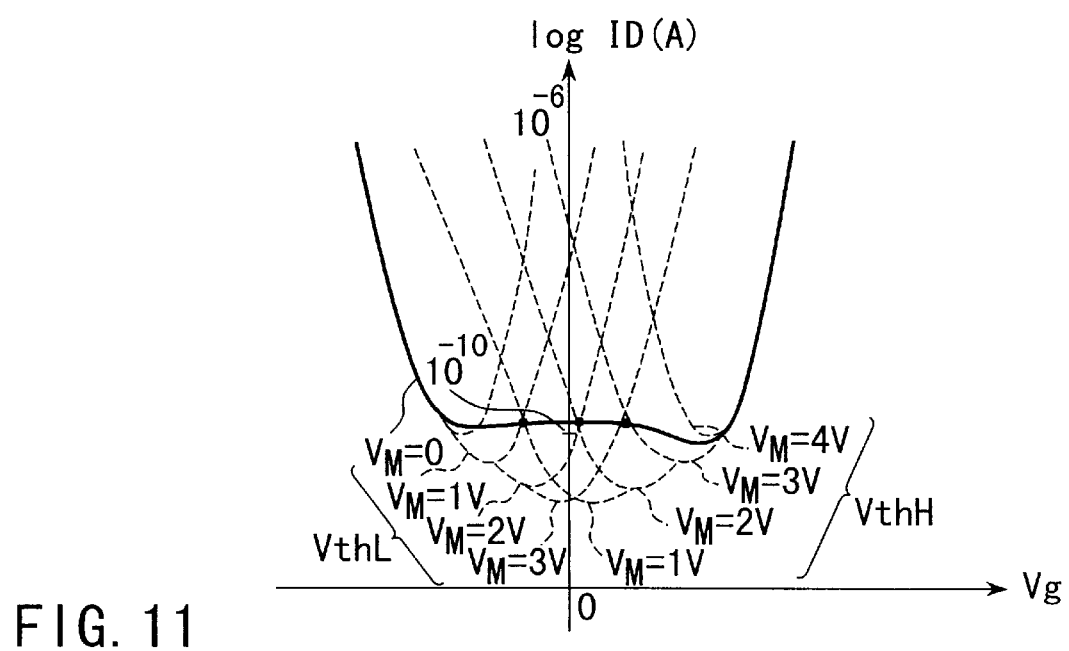
FIG. 11 is a graph of current-voltage characteristics when the memory cell transistor is in a write state.

FIG. 10 is a simple equivalent circuit diagram of the memory cell transistor, and FIG. 11 is a graph showing current-voltage characteristics of the memory cell transistor in the write mode.

Let us consider that two transistors having different threshold voltages are connected in series, and a voltage of 0V, that of 4V, and that of VG are applied to the source ($n^+$-type diffusion layer 18A), the drain ($n^+$-type diffusion layer 18B), and the gate (control gate electrode 17), respectively. The drain and source of the two transistors are short-circuited and set at an intermediate potential VM. The current-voltage characteristics of the transistor having threshold voltage VtH are as follows. When the intermediate potential VM is changed from 1V to 4V, the hole current in the sub-threshold region hardly varies, whereas the electron current moves horizontally to the positive by an increase of VM. The crossing point of the characteristics of both the currents having the same intermediate potential VM indicates the characteristics of the actual transistor.

The followings are found by the current-voltage characteristics shown in FIG. 11. By connecting two transistors having different threshold voltages in series, the voltage range of the off-state gate is larger than a difference between VthH and VthL, and can be widened more than that in a single transistor.

It is apparent from FIG. 8 that the voltage range of the off-state gate has only to include a range from the readout voltage of 0V, which is to be applied to the gate electrode in the read mode, to not higher than the threshold voltage (Vthw) in the write mode of the memory cell.

If, therefore, a difference between the highest threshold voltage and the lowest threshold voltage in the regions having different threshold voltages is set higher than a difference between the maximum value of the threshold voltage of a cell to which data is written and a potential (e.g., 0V) applied to a selected word line in the read mode, the memory cell transistor can be turned off when 0V is applied to the gate in the read mode. In other words, if, in the NAND type flash EEPROM, a difference between the highest threshold voltage and the lowest threshold voltage in the regions having different threshold voltages is set higher than a difference between a potential applied to the control gate electrode of a selected memory cell of the NAND string in the read mode and a potential applied to the other control gate electrode, the memory cell transistor can be turned off when the voltage of 0V is applied to the gate in the read mode.

The current-voltage characteristic of a memory cell transistor in an erase state is, as shown in FIG. 11, moved to the negative as it is. This memory cell transistor is therefore turned on by applying a voltage of 0V, which is higher than the threshold voltage, to the control gate in the read mode.

Since the memory cell transistor of the second embodiment is turned off not by blocking of holes due to a pn junction but by the resistance of the active region (channel), the resistivity has to be as high as possible. If the cell current in the read mode is set to about several microamperes, the off current should be set to not higher than several tens of nanoamperes in order to obtain the on/off ratio of about four digits.

For example, when the thickness of the active region is about 100 nm and a voltage of 1V is applied to the drain, the resistance of about $1 \times 10^5$ $\Omega$cm is required. In this case, the impurity concentration of n-type silicon is $1 \times 10^{12}$ cm$^{-3}$ or lower.

In the second embodiment, the active region between the source and drain of a memory cell transistor is constituted of two regions having different threshold voltages. However, the active region can be constituted of three or more regions having different threshold voltages. As one example, FIG. 12 illustrates an active region including three regions having different threshold voltages.

Figure 12:
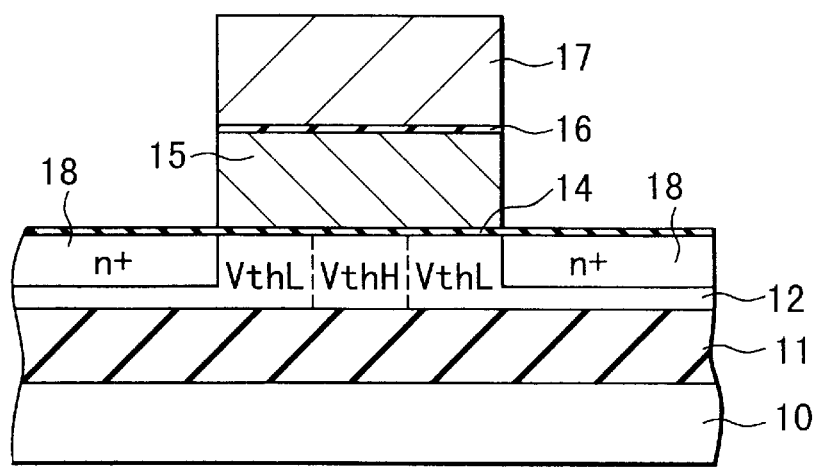
FIG. 12 is a cross-sectional view of the structure of still another memory cell transistor used in the NAND type flash EEPROM according to the second embodiment of the present invention.

In FIG. 12, one of two diffusion layers 18 need not be fixed but can be used as a source or a drain. In other words, a MOS transistor capable of causing a current to flow in two directions can be obtained.

As described above, a difference in the potential applied between the source and drain of the memory cell transistor corresponds to the bit line potential (e.g., 1V) in the read mode. However, a voltage of about 8V is applied between the source and drain of a select gate transistor. Since, in the select gate transistor, a through current flowing from the bit line to the source line in the write mode is suppressed, a leakage current should be very small. For this reason, the memory cell transistor of the second embodiment cannot be used for the select gate transistor.

In the second embodiment, therefore, the active region where a select gate transistor is formed is the same p-type as that of the conventional bulk silicon transistor, as illustrated in FIG. 4C. The select gate transistor has the structure for blocking a hole current by a pn junction formed by the n-type diffusion layer and p-type active region.

The active region (substrate surface) where a memory cell transistor is formed, is an n-type and so is the diffusion layer. In other words, the polarity of the active region of the select gate transistor and that of the memory cell transistor are opposite to each other. The polarities of the active region and diffusion layer of the select gate transistor are opposite to each other, while those of the memory cell transistor are the same.

A peripheral circuit (MOS transistor) for driving a memory cell can also be formed on the SOI region. In an n-channel MOS transistor used in a CMOS circuit, a p-type active region and an n-type diffusion layer are employed, as in the select gate transistor. In a p-channel MOS transistor used in a CMOS circuit, an n-type active region and a p-type diffusion layer are used.

In each transistor, a threshold voltage can be selected in accordance with a desired set value. A memory cell transistor can be formed on a bonded SOI substrate or on an SIMOX substrate. It can also be formed on an epitaxial layer on an insulative substrate by solid phase growth. The materials for the active region can be polysilicon or amorphous silicon as well as monocrystalline silicon. The materials other than the silicon type can be used for the active region.

The interlayer insulation film formed on an element such as the foregoing memory cell transistor and select gate transistor can be used as insulating material having an SOI structure, and an element can be formed on the insulating material to achieve three-dimensional integration. Otherwise, the above memory cell transistor and select gate transistor can be formed on a transparent insulative substrate such as a glass substrate, and they can be formed on a chip together with a display device and the like.

In order to form two regions having different threshold voltages in the active region as illustrated in FIG. 9, a method of partially varying an amount of channel ion implantation and a method of partially varying the thickness of the gate insulation film can be considered; however, the present invention is not limited to these methods.

In the NAND type flash EEPROM according to the second embodiment, data can be erased in sequence for each of memory cells in a NAND string without executing any block batch erasure.

One method of manufacturing a NAND type flash EEPROM using memory cells of a transistor having the structure shown in FIG. 9, will be described with reference to FIGS. 9 and 4B.

First an insulation layer (e.g., silicon oxide film) 11 is formed on a silicon semiconductor substrate 10, and a silicon thin film 12 of low impurity concentration, which serves as an active region, is formed on the insulation layer 11, thereby obtaining a substrate having an SOI structure. The insulation layer 11 is formed by thermally oxidizing the surface of the substrate 10 or depositing an insulation film such as a silicon dioxide film and a silicon nitride film on the substrate 10. The SOI substrate can be constituted by bonding or replaced with an SIMOX substrate.

A desired dose of impurities, phosphorus (P) and boron (B) and is ion-implanted into that region of the silicon thin film 12 which increases in impurity concentration, such a region where a peripheral circuit (MOS transistor) is formed and a region where a select gate transistor is formed.

For example, ion implantation is performed at least two times to form two regions having different threshold voltages, that is, a region having a threshold voltage of VthL and a region having a threshold voltage of VthH, as shown in FIG. 9.

Then, a grid-pattern mask is formed on the silicon thin film by the lithographic technique. Using this pattern, the silicon thin film 12 is etched to form a grid-pattern active region. The pitch of the grid pattern or the pitch between a plurality of line patterns extending in a column direction can be narrowed to the limit of the lithographic technique.

A trench between the active regions is filled with insulating material 13 such as a silicon oxide film, a TEOS film and a silicon nitride film. The surface of the insulating material 13 is flattened using CMP and RIE to complete element isolation.

A gate insulation film (tunnel oxide film) 14 is formed on the surface of the active region by thermal oxidation. A conductor serving as a floating gate electrode 15 is formed on the gate insulation film 14 by LPCVD. A slit-like trench is formed in the conductor. After that, an insulation film 16 such as an ONO (silicon oxide-silicon nitride-silicon oxide) film is formed on the conductor. Another conductor serving as a control gate electrode 17 is formed on the insulation film 16 by LPCVD.

A mask is formed in a line pattern extending in the row direction by the lithographic process. Using the line pattern mask, the conductor is etched to form the floating gate electrode 15 and control gate electrode 17. Using these electrodes 15 and 17 as a mask, impurities such as phosphorus and arsenic having the same polarity as that of the silicon thin film 12 are ion-implanted into the film (active region) 12 thereby to form an $n^+$-type diffusion layer 18A serving as a source and an $n^+$-type diffusion layer 18B serving as a drain.

A memory cell is thus obtained by the above process. After the process, a normal interlayer film and a wire are formed.

As described above, in the first and second embodiments, the NAND type flash EEPROM is formed on the SOI substrate, the element region (active region) is processed in a grid pattern, and a trench between the element regions is filled with insulating materials. In other words, since the elements in the row direction are completely separated from each other by the insulating materials, an interval between the elements in the row direction (lines extending in the column direction) can be set as small as possible by the lithographic process. Thus, a NAND type flash EEPROM, which is improved in element isolation and reduced in parasitic resistance and parasitic capacitance and which is capable of miniaturization and high-degree of integration, can be provided (first effect).

As described above, it is desirable to achieve block batch erasure for erasing data of a plurality of memory cells in a block at the same time when the NAND type flash EEPROM is formed on the SOI substrate. In the second embodiment, a channel of each of memory cells constituting a NAND string includes at least two impurity concentration regions having different threshold voltages. In the second embodiment, therefore, the block batch erasure, which is one feature of the flash EEPROM, can be achieved, while creating the first effect (feature due to SOI).

An MIS transistor having the characteristic as shown in FIG. 11 is not limited to the NAND type flash EEPROM having an SOI structure but can be applied to another semiconductor device. The new MIS transistor having the characteristic as shown in FIG. 11 is one of the features of the present invention.

A NAND type flash EEPROM according to a third embodiment of the present invention will now be described. In this EEPROM, the block batch erasure can be performed as in the second embodiment.

Figure 13A:
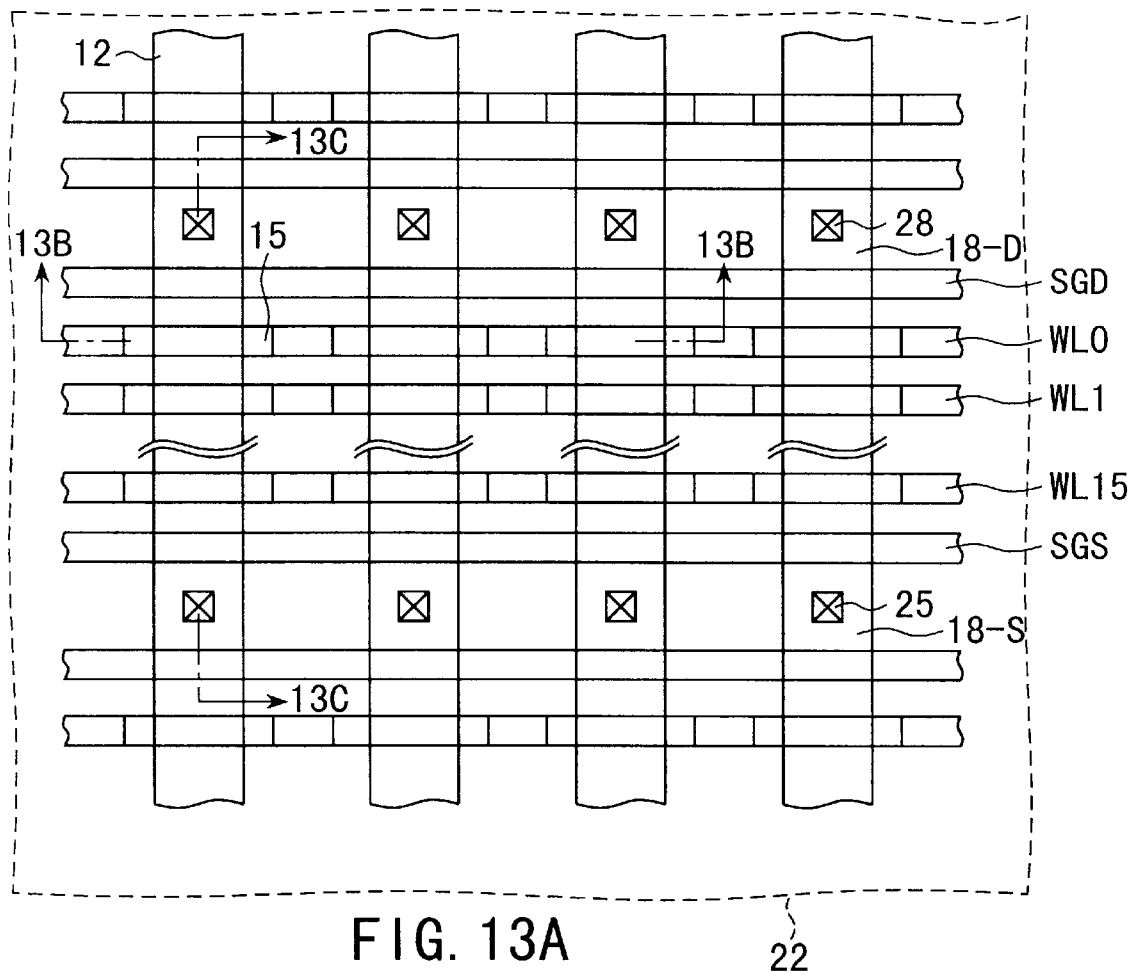
FIG. 13A is a layout view of a NAND type flash EEPROM according to a third embodiment of the present invention.
Figure 13B:
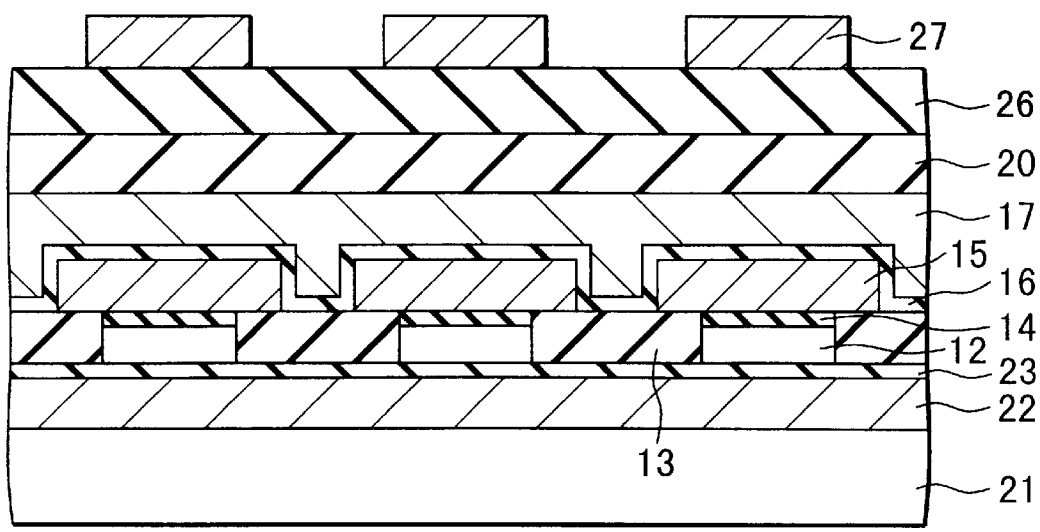
FIG. 13B is a cross-sectional view taken along line 13B—13B of FIG. 13A.
Figure 13C:
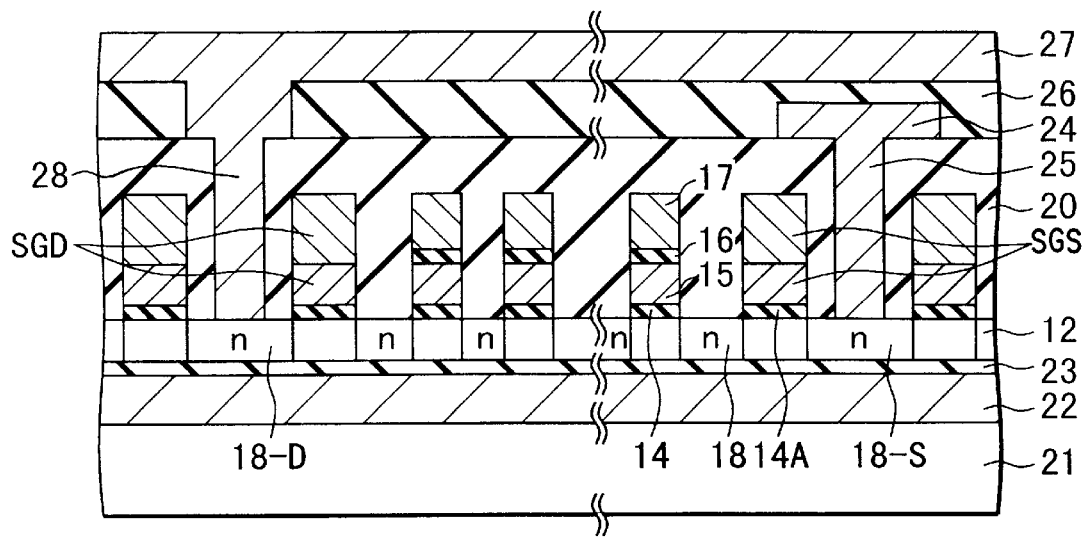
FIG. 13C is a cross-sectional view taken along line 13C—13C of FIG. 13A.
Figure 13D:
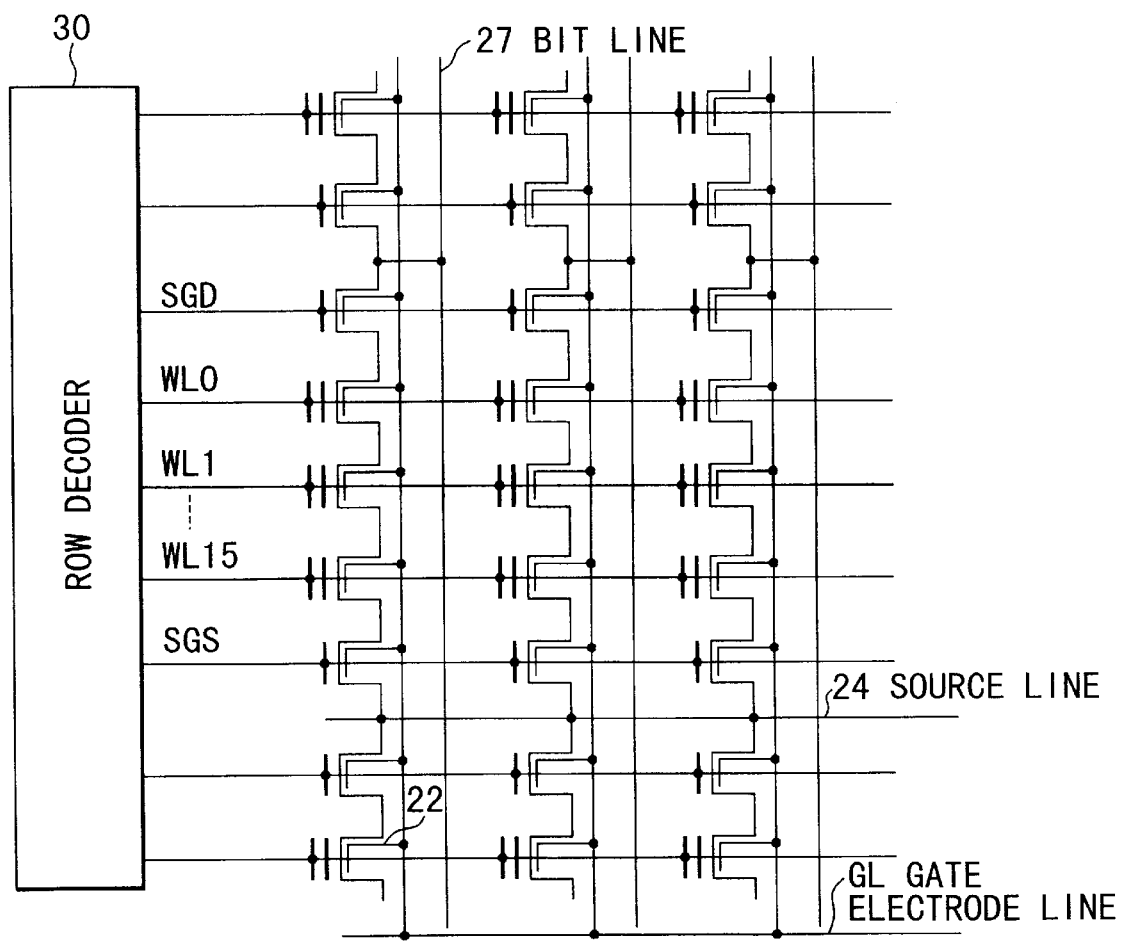
FIG. 13D is an equivalent circuit diagram of a NAND type flash EEPROM according to the third embodiment of the present invention.

FIG. 13A is a layout plan view of the NAND type flash EEPROM of the third embodiment of the present invention. FIG. 13B is a cross-sectional view taken along line 13B—13B of FIG. 13A, and FIG. 13C is a cross-sectional view taken along line 13C—13C of FIG. 13A. FIG. 13D is an equivalent circuit diagram of the NAND type flash EEPROM.

The NAND type flash EEPROM is constituted as illustrated in FIGS. 13A to 13C. A first gate electrode 22 is formed like a plate on an insulative substrate 21. A first gate insulation film 23 is formed on the first gate electrode 22, and silicon thin films (active regions) 12 are formed on the first gate insulation film 23. The films 12 are obtained by single-crystallization of amorphous silicon or polysilicon. The technique of forming the silicon thin films 12 on the insulation layer (first gate insulation film 23) is called SOI (silicon on insulator).

The silicon thin films 12 are formed like islands in the column direction on the first gate insulation film 23 and each used as an active layer. A space between the island-like silicon thin films 12 is filled with insulating material (e.g., silicon oxide film) 13 serving to isolate the elements.

In the third embodiment, after the silicon thin films 12 are patterned like islands by lithography, a space between the films 12 is filled with the insulating material 13, thereby to completely isolate adjacent elements in the row direction. In principle, the width of the insulating material 13 (interval between the elements) in the row direction can be set to the minimum which depends upon the lithography and etching.

In the silicon thin films 12, p-type impurities are introduced. As illustrated in FIG. 13A, an n-type source diffusion layer 18-S is formed in part of the silicon thin films 12, while an n-type drain diffusion layer 18-D is formed in another part thereof. Between the source and drain diffusion layers 18-S and 18-D, a NAND string constituted of, e.g., 16 memory cell transistors connected in series is formed, and two select gate transistors are provided at both ends of the NAND string. The first gate electrode 22 is formed so as to include the NAND string in a block, which is a unit of erasure, and two select gate transistors at both ends thereof. The first gate electrode 22 can be formed for each block or for a plurality of blocks.

As illustrated in FIG. 13C, each of the memory cell transistors is constituted of the first gate electrode 22, first gate insulation film 23, silicon thin film (active region) 12, second gate insulation film (tunnel oxide film) 14, floating gate electrode (charge storing layer) 15, third gate insulation film (e.g., ONO film) 16, a control gate electrode 17, and n-type diffusion layer 18.

The second gate insulation film (tunnel oxide film) 14 is formed on the channel region of each memory cell transistor, and the floating gate electrode 15 is formed on the film 14. The third gate insulation film 16 is formed on the electrode 15, and the control gate electrode 17 is formed on the film 16. The n-type diffusion layer 18, which serves as a source or a drain, is formed in the silicon thin film 12 between the control gate electrodes 17 of the memory cell transistors. The side edge of the floating gate electrode 15 in the channel length direction is aligned with that of the control gate electrode 17 since the electrode 15 is etched in self-alignment with the electrode 17.

As shown in FIG. 13C, the select gate transistor, which is connected to the source diffusion layer 18-S, is constituted of the first gate electrode 22, the first gate insulation film 23, silicon thin film (active region) 12, gate insulation film (e.g., a silicon oxide film) 14A, gate electrode SGS, and n-type diffusion layers 18 and 18-S.

The gate insulation film 14A is formed on a channel region of the select gate transistor, and the gate electrode SGS is formed on the film 14A. The n-type diffusion layer 18-S serving as a source and the n-type diffusion layer 18 serving as a drain, are formed in the silicon thin film 12 on both sides of the gate electrode SGS.

As shown in FIG. 13C, the select gate transistor, which is connected to the source diffusion layer 18-D, is constituted of the first gate electrode 22, first gate insulation film 23, silicon thin film (active region) 12, gate insulation film (e.g., a silicon oxide film) 14A, gate electrode SGD, and n-type diffusion layers 18 and 18-D.

The gate insulation film 14A is formed on a channel region of the select gate transistor, and the gate electrode SGD is formed on the film 14A. The n-type diffusion layer 18 serving as a source and the n-type diffusion layer 18-D serving as a drain, are formed in the silicon thin film 12 on both sides of the gate electrode SGS.

An interlayer insulation film 20 is formed on the entire surface of the substrate including the control gate electrode 17. A source line 24 is formed on the film 20. A source line contact portion 25 for connecting the source line 24 and source diffusion layer 18-S is formed in a contact hole provided in the interlayer insulation film 20. An interlayer insulation film 26 is formed on the entire surface of the film 20 including the source line 24. A bit line 27 is formed on the interlayer insulation film 26. A bit line contact portion 28 for connecting the bit line 27 and the drain diffusion layer 18-D is formed in a contact hole provided in the interlayer insulation films 20 and 26.

FIG. 13D illustrates part of an equivalent circuit of the EEPROM so constituted. The word lines WL0 to WL15 of the memory cells and the gate electrodes SGS and SGD of the select gate transistor are connected to a row decoder 30. The source line 24 is connected to the source of the select gate transistor having the gate electrode SGS. The bit line 27 is connected to the drain of the select gate transistor having the gate electrode SGD. A gate electrode line GL is connected to the memory cell and the first gate electrode 22 provided in the select gate transistor.

An operation of the NAND type flash EEPROM according to the third embodiment of the present invention will now be described.

Figures 14A, 14B:
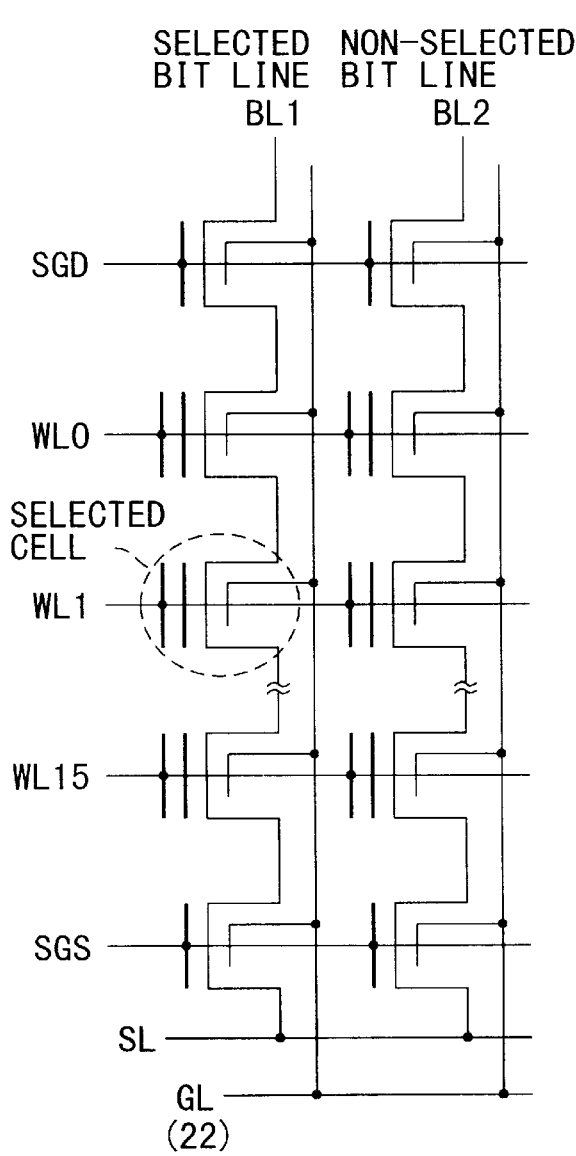
FIG. 14A is a circuit diagram of a NAND string and a select gate transistor constituting a NAND type flash EEPROM according to the third embodiment of the present invention.
FIG. 14B is a diagram showing a relationship in potential in the erase, write and read modes of the NAND type flash EEPROM according to the third embodiment of the present invention.

FIG. 14A is a circuit diagram of a NAND string and a select gate transistor constituting the NAND type flash EEPROM. FIG. 14B is a diagram showing the relationship in potential in the erase, write and read modes of the EEPROM.

First an erase operation will be described.

In the block batch erasure, the following voltages are applied to the respective lines. A negative high voltage of, e.g., −20V is applied to all word lines WL0 to WL15 of memory cells in a selected block, while the word lines of memory cells in a non-selected block are set in a floating state or at a low voltage of, e.g., 0V. A low voltage of, e.g., 0V is applied to bit lines BL1, BL2, . . . and source line SL in the block and gate electrodes SGD and SGS of a selected gate transistor. A positive intermediate voltage of, e.g., 1V is applied to a gate electrode line GL connected to a first gate electrode 22.

Figure 15:
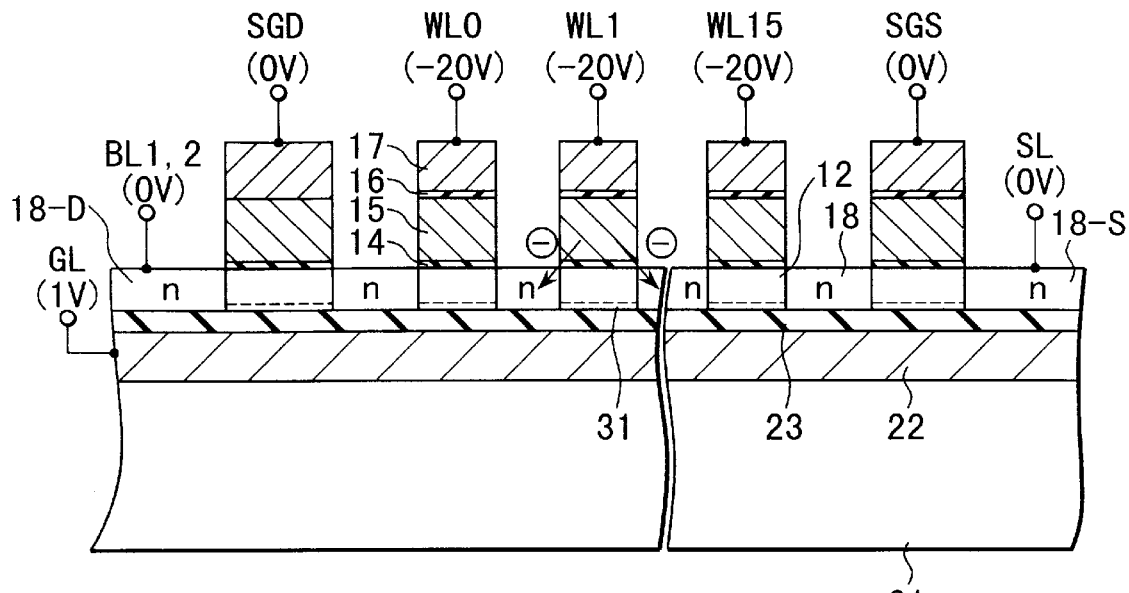
FIG. 15 is a cross-sectional view of memory cells showing the concept of forming a channel in the block batch erase mode.

FIG. 15 is a cross-sectional view of memory cells showing the concept of forming a channel in the block batch erase mode. Since an inverted channel 31 is formed in the interface of a silicon thin film (active region) 12 on a first gate insulation film 23 on a first gate electrode 22, the potentials of the bit lines BL1 and BL2 can be transferred to an $n^+$-type diffusion layer 18 of each of the memory cells. Even though the selected gate transistor and memory cells are in a cut-off state, 0V can be transferred to the channels of all the memory cells. The block batch erase operation can thus be performed.

In memory cells formed on a semiconductor substrate, a high voltage needs to be transferred to the whole surface of a block region for erasure. It is thus difficult to perform a high-speed erase operation due to parasitic capacitance formed between the diffusion layer and substrate. Since, however, almost all the capacitance between the diffusion layer and substrate can be ignored in SOI, high-speed erasure can be achieved. The positive intermediate voltage applied to the first gate electrode 22 (gate electrode line GL) needs to be higher than the inverted threshold voltage of the active regions of the memory cells and selected gate transistor, and can be varied when the need arises.

Secondly a write operation will be described.

In the write operation, the following voltages are applied to the respective lines. A positive high voltage of, e.g., 20V is applied to word line WL1 of a selected memory cell, and 0V is applied to source line SL and selected bit line BL1 thereof.

In order to transfer the potential of the bit line BL1 to the channel of the selected memory cell, a non-selected memory cell connected to the bit line BL1 needs to be turned on. Thus, a positive intermediate voltage of, e.g., 10V is applied to word lines WL0 and WL2 to WL15 of the non-selected memory cell. Moreover, a selected gate transistor on the bit line side needs to be turned on to transfer the potentials of bit lines BL1 and BL2 to the memory cells. Consequently, the positive intermediate voltage, e.g., 10V is applied to the gate electrode SGD of the selected gate transistor on the bit line side.

The current flowing through the source line SL and bit lines BL1 and B12 needs to reduce since they greatly decrease the boost ability of a booster circuit. Thus, the cut-off state is obtained by applying 0V to the gate electrode SGS of a selected gate transistor.

In a non-selected memory cell located at the intersection of the non-selected bit line BL2 and the word line WL1 to which 20V is applied, an error in writing has to be prevented. If the channel potential of a non-selected memory cell is increased to about 8V, the error can be prevented. Consequently, 8V is applied to the non-selected bit line BL2 and transferred to the non-selected memory cell. Moreover, a voltage of, e.g., 8V is applied to the first gate electrode 22 (gate electrode line GL).

Since, as described above, an inverted electronic channel is formed in the active region of the selected memory cell, electrons are injected from the channel to a floating gate electrode 15. As a result, the threshold voltage of the selected memory cell becomes higher than the reference potential.

Finally a read operation will be described.

In the read operation, the following voltages are applied to the respective lines. For example, 1V is applied to a selected bit line BL1 and a non-selected bit line BL2. A low voltage of, e.g., 0V is applied to a selected word line WL1. An intermediate voltage of, e.g., 3V is applied to non-selected word lines WL0 and WL2 to WL15 other than the selected word line WL1 and gate electrodes SGD and SGS of a selected gate transistor. The non-selected memory cells of the non-selected word lines WL0 and WL2 to WL15 and the selected gate transistor are turned on. A voltage of, e.g., 0V is applied to the source line SL and first gate electrode 22 (gate electrode line GL).

In the read mode, 0V is applied to the word line WL1 of a selected memory cell to determine whether the threshold voltage is higher than 0V or not. If the selected memory cell is in an erase state, the memory cell is turned on to cause a channel current to flow; therefore, it is understood that the threshold voltage is lower than 0V. On the other hand, if the selected memory cell is in a write state, the memory cell is not turned on and no channel current flows; thus, it is understood that the threshold voltage is higher than 0V.

As described above, according to the third embodiment, the NAND type flash EEPROM is formed on the SOI substrate, the element regions (active regions) are patterned like islands, and a trench between the element regions is filled with insulating material. In other words, the elements in the row direction are completely separated from each other by the insulating material, so that an interval between the elements in the row direction (the lines extending in the column direction) can be set as small as possible by lithography. Thus, a NAND type flash EEPROM, which is improved in element isolation and reduced in parasitic resistance and parasitic capacitance and which is capable of miniaturization and high-degree of integration, can be provided (first effect).

As described above, it is desirable that the block batch erase operation can be achieved in which data of a plurality of memory cells in a block are erased at once. Thus, in the third embodiment, the plate-like first gate electrode 22 is formed on one side of the active region (silicon thin film) which is opposite to the other side thereof on which the floating gate is formed. Since a channel can be formed in the interface of the active region on the insulation film on the first gate electrode 22, the potentials of the bit lines can be transferred to the channels of all the memory cells. In the third embodiment, therefore, the block batch erasure, which is one feature of the flash EEPROM, can be achieved, while creating the first effect (feature due to SOI).

A NAND type flash EEPROM according to a fourth embodiment of the present invention will now be described. This EEPROM is capable of performing a block batch erase operation and reducing a bit line potential in the write mode.

Figure 16A:
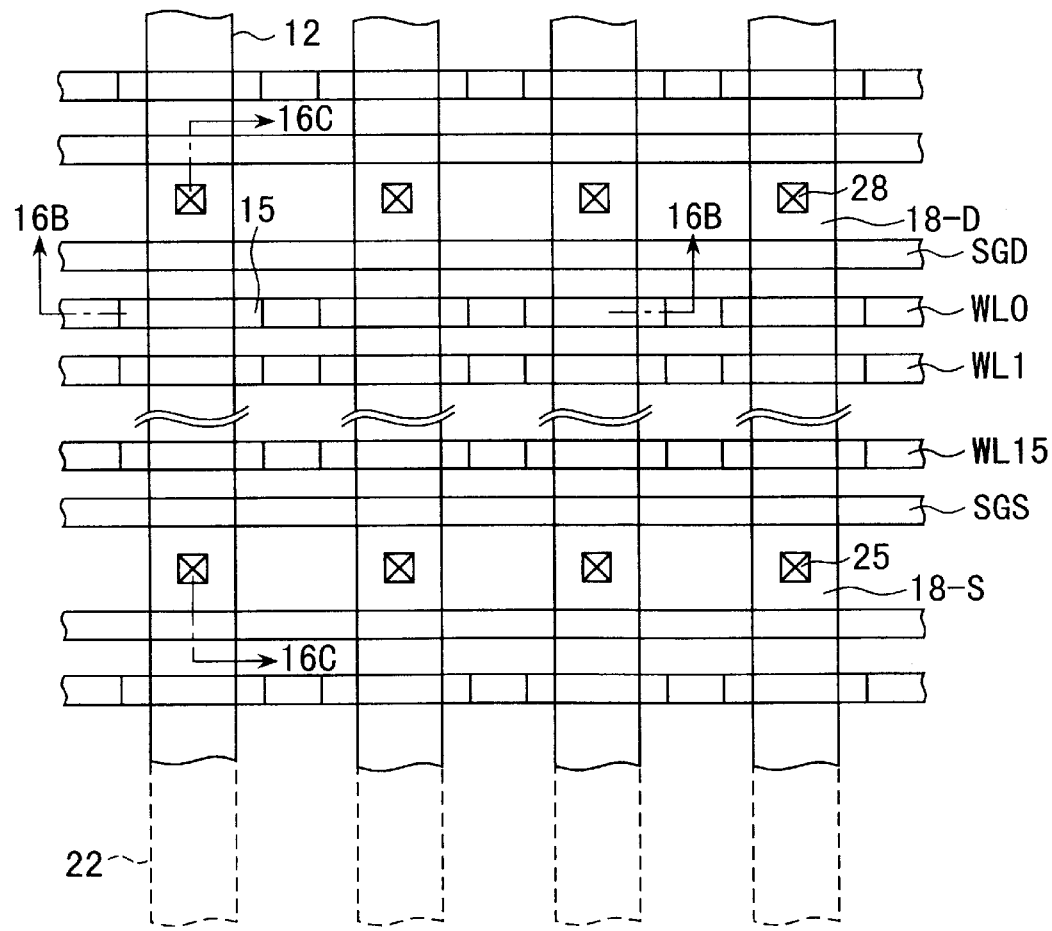
FIG. 16A is a layout view of a NAND type flash EEPROM according to a fourth embodiment of the present invention.
Figure 16B:
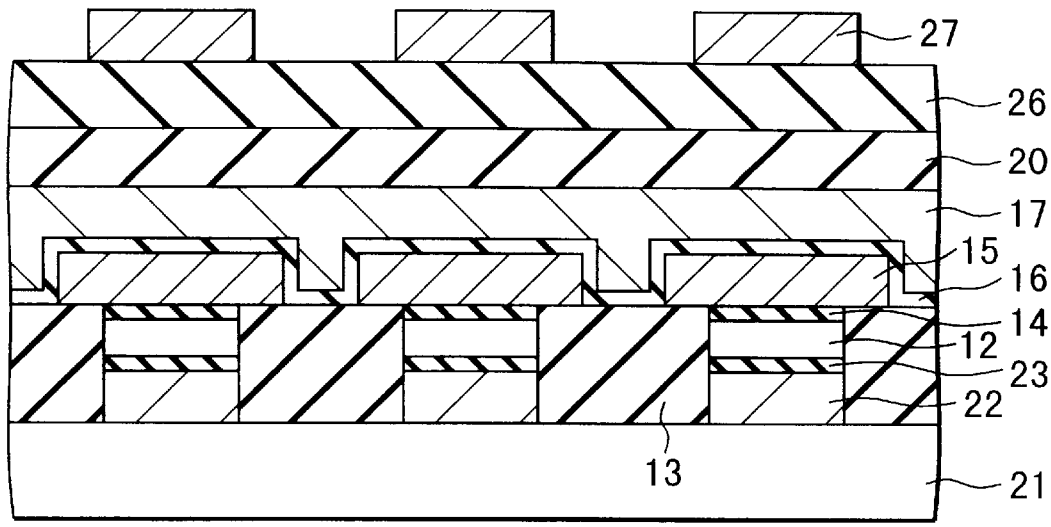
FIG. 16B is a cross-sectional view taken along line 16B—16B of FIG. 16A.
Figure 16C:
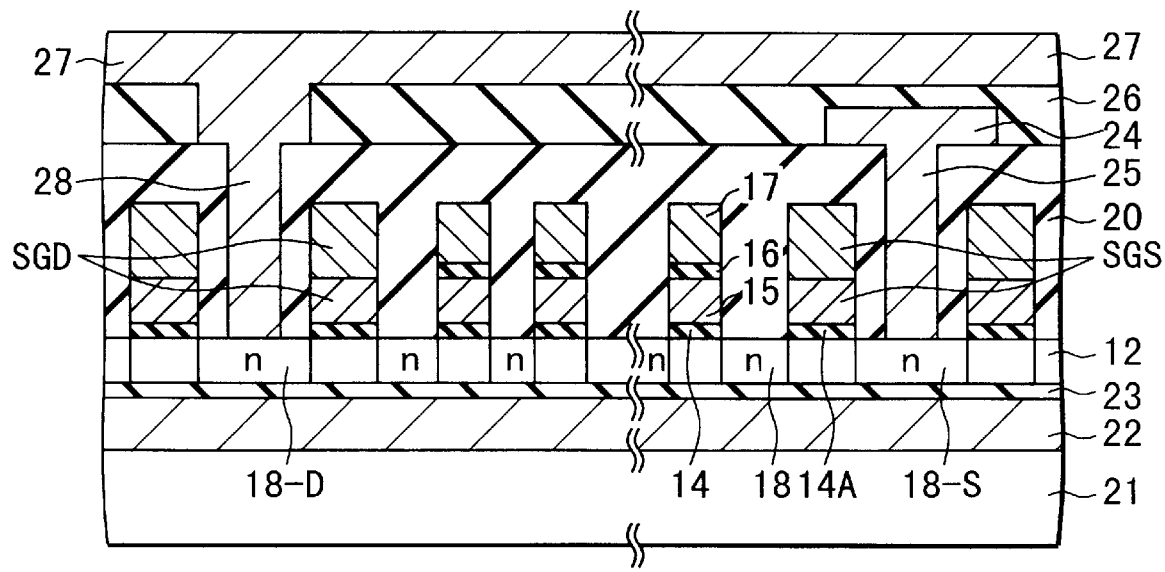
FIG. 16C is a cross-sectional view taken along line 16C—16C of FIG. 16A.
Figure 16D:
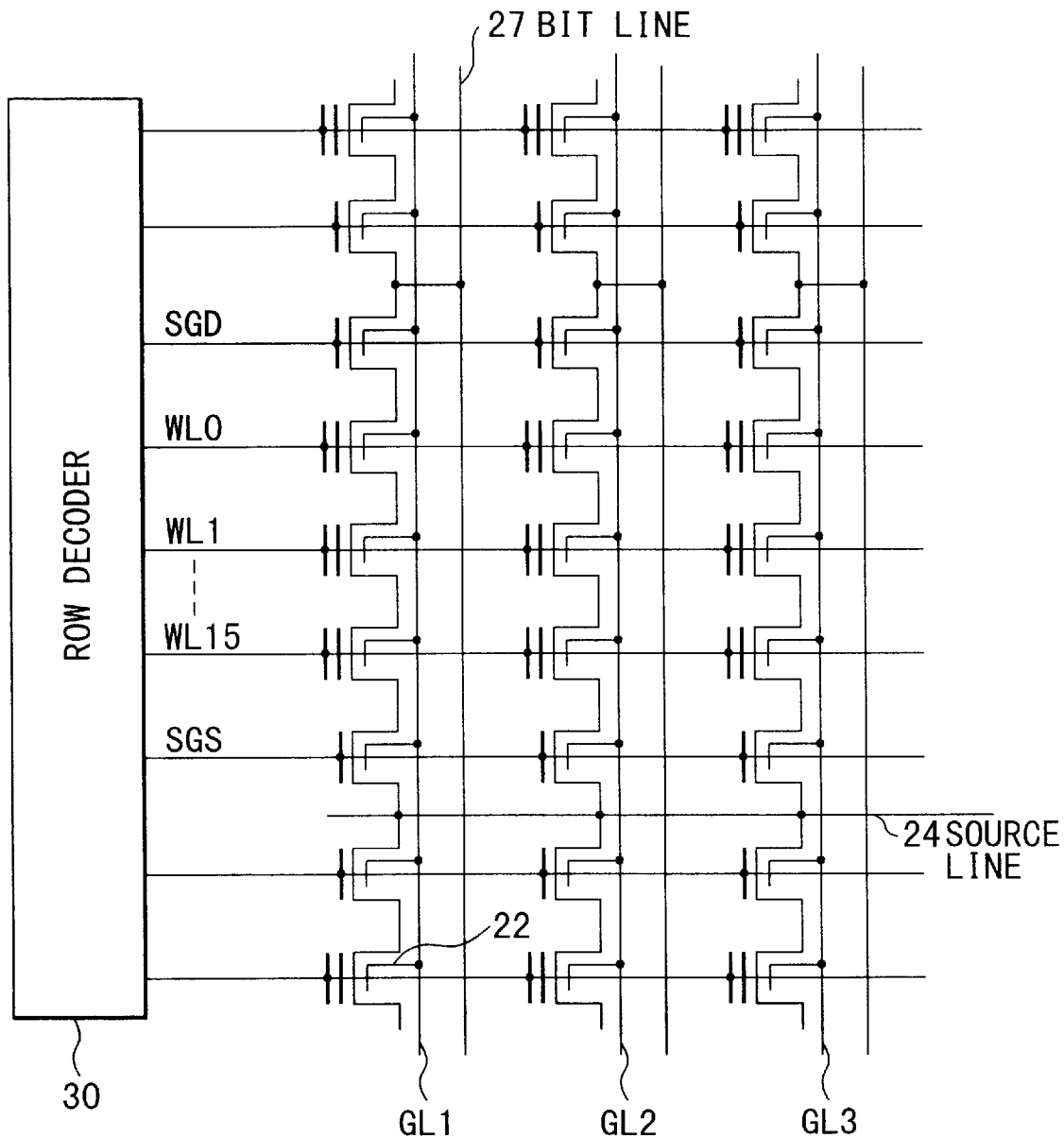
FIG. 16D is an equivalent circuit diagram of a NAND type flash EEPROM according to the fourth embodiment of the present invention.

FIG. 16A is a layout plan view of the NAND type flash EEPROM of the fourth embodiment of the present invention. FIG. 16B is a cross-sectional view taken along line 16B—16B of FIG. 16A, and FIG. 16C is a cross-sectional view taken along line 16C—16C of FIG. 16A. FIG. 16D is an equivalent circuit diagram of the NAND type flash EEPROM.

The NAND type flash EEPROM is constituted as illustrated in FIGS. 16A to 16C. The fourth embodiment differs from the third embodiment in that a first gate electrode 22 and a first gate insulation film 23 are formed like an island in the column direction. The first gate electrode 22 is formed for each bit line so as to include NAND strings connected to one bit line and two select gate transistors at both ends of each of the NAND strings. The first gate insulation film 23 is formed on the first gate electrode 22, and the silicon thin film (active region) 12 is formed on the first gate insulation film 23. The films 12 are obtained by single-crystallization of amorphous silicon or polysilicon. The technique of forming the silicon thin film 12 on the insulation film (first gate insulation film 23) is called SOI (silicon on insulator).

The silicon thin film 12 is so formed in the column direction that its side edges are aligned with those of the first gate insulation film 23 and used as an active layer. A space between the island-like silicon thin film 12, first gate insulation film 23, and first gate electrode 22 is filled with insulating material (e.g., silicon oxide film) 13 serving to isolate the elements. Since the fourth embodiment is the same as the third embodiment, except that the first gate electrode 22 is formed for each bit line so as to include the NAND string connected to one bit line 27 and two select gate transistors at both ends thereof, its description is omitted.

FIG. 16D illustrates part of an equivalent circuit of the EEPROM so constituted. The word lines WL0 to WL15 of the memory cells and the gate electrodes SGS and SGD of the select gate transistor are connected to a row decoder 30. The source line 24 is connected to the source of the select gate transistor having the gate electrode SGS. The bit line 27 is connected to the drain of the select gate transistor having the gate electrode SGD. Gate electrode lines GL1, GL2 and GL3 are connected to the memory cells connected in series in the column direction and the first gate electrode 22 of the select gate transistor. In this circuit, when select gate transistors are each constituted of the first gate electrode, first insulation film and silicon thin film (active region), the threshold voltage of the select gate transistor on the source line side is set higher than that of the select gate transistor on the bit line side.

An operation of the NAND type flash EEPROM according to the fourth embodiment of the present invention will now be described.

Figures 17A, 17B:
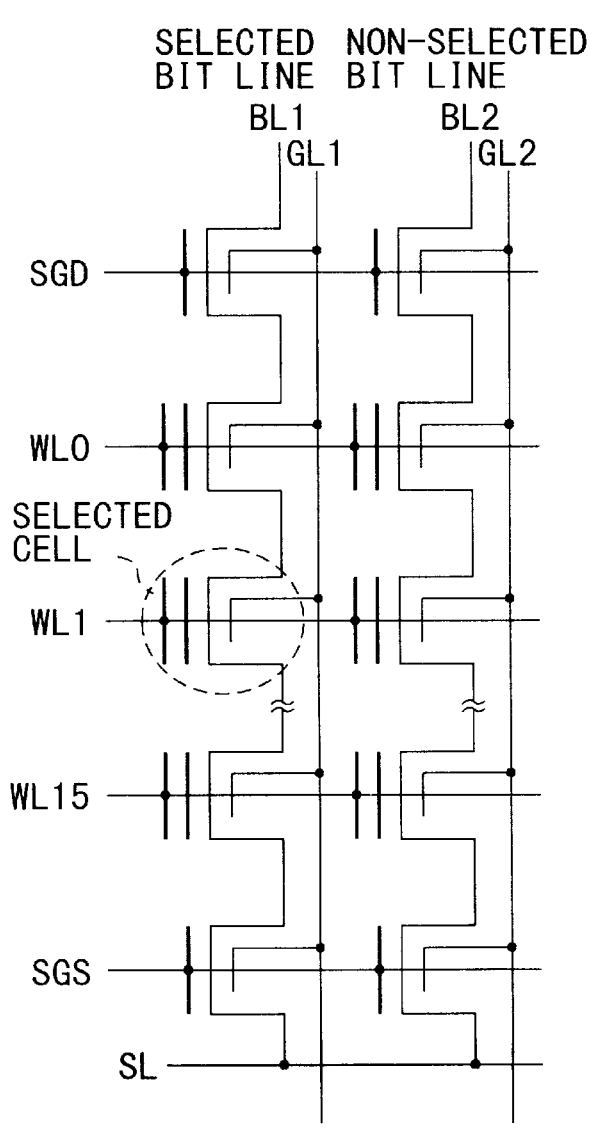
FIG. 17A is a circuit diagram of a NAND string and a select gate transistor constituting a NAND type flash EEPROM according to the fourth embodiment of the present invention.
FIG. 17B is a diagram showing a relationship in potential in the erase, write and read modes of the NAND type flash EEPROM according to the fourth embodiment of the present invention.

FIG. 17A is a circuit diagram of a NAND string and a select gate transistor constituting the NAND type flash EEPROM. FIG. 17B is a diagram showing the relationship in potential in the erase, write and read modes of the EEPROM.

First an erase operation will be described.

In the block batch erasure, as in the third embodiment, the following voltages are applied to the respective lines. A negative high voltage of, e.g., −20V is applied to all the word lines WL0 to WL15 of memory cells in a selected block, while the word lines of memory cells in a non-selected block are set in a floating state or at a low voltage of, e.g., 0V. A low voltage of, e.g., 0V is applied to bit lines BL1, BL2, . . . and source line SL in the block and gate electrodes SGD and SGS of a selected gate transistor. A positive intermediate voltage of, e.g., 1V is applied to gate electrode lines GL1 and GL2 connected to the first gate electrode 22. The block batch erase operation can thus be performed.

The positive intermediate voltage applied to the first gate electrode 22 (gate electrode lines GL1 and GL2) can be varied when the need arises. However, it needs to be higher than the inverted threshold voltage of the active regions of the memory cells and selected gate transistor.

A write operation will be described. In particular, the nonvolatile semiconductor memory device of the fourth embodiment is effective in the write mode.

In the write operation, the following voltages are applied to the respective lines. A positive high voltage of, e.g., 20V is applied to the word line WL1 of a selected memory cell, and a low voltage of, e.g., 0V is applied to the word lines WL0 and WL2 to WL15. Further, a low voltage of, e.g., 0V is applied to the bit lines BL1 and BL2, source line SL and gate electrodes SGS and SGD of a selected gate transistor.

A positive intermediate voltage of, e.g., 1V, which is higher than the threshold voltage of a selected gate transistor on the bit line side and lower than that on the source line side, is applied to the gate electrode line having a select memory cell or the gate electrode line GL1 formed along the selected bit line BL1. A low voltage of, e.g., 0V is applied to the gate electrode line having no select memory cells or the gate electrode line GL2 formed along the non-selected bit line BL2.

Figure 18A:
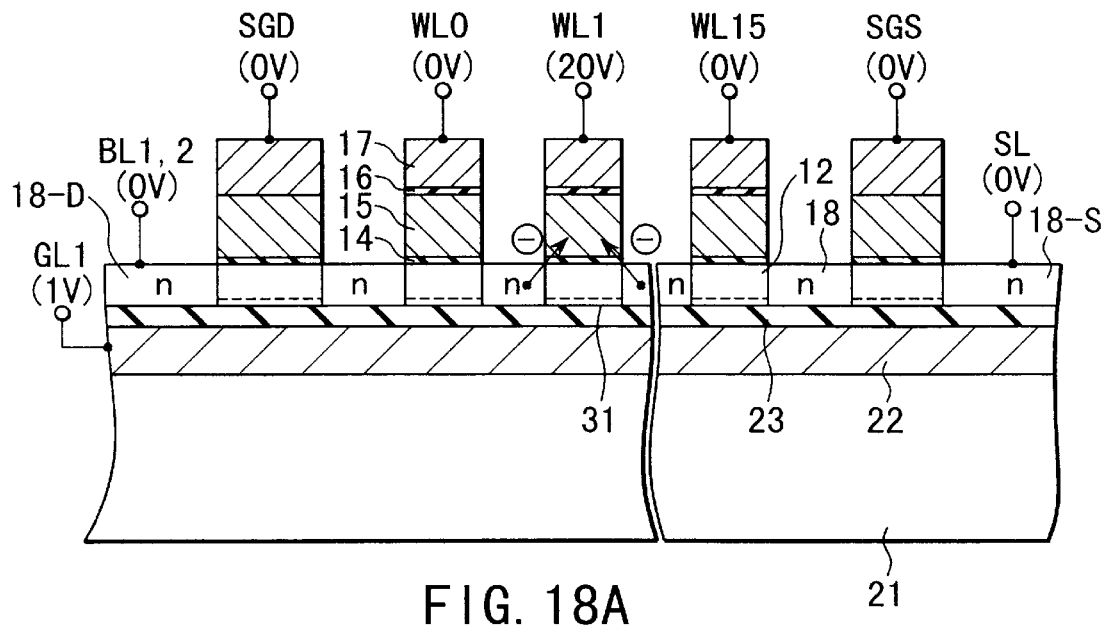
FIG. 18A is a cross-sectional view of the NAND type flash EEPROM showing the concept of forming a channel in the write mode.

FIG. 18A is a cross-sectional view of memory cells connected to the selected bit line BL1 in the write mode, which shows the concept of forming a channel in the write mode. Since a channel 31 is formed in the interface of the silicon thin films (active regions) 12 on the first gate electrode side 22, the potential of the bit line BL1 can be transferred to the memory cells. Charges are therefore transmitted to/received from the floating gate electrode 15 in the memory cell connected to the word line WL1 to which a positive high voltage is applied.

The intermediate voltage applied to the gate electrode line GL1 needs to be higher than the inverted threshold voltage in the active regions of the memory cells and select gate transistor, and can be varied when the need arises. Since, however, the select gate transistor on the source line side is in a cut-off state, the bit line SL1 and source line SL are not short-circuited.

Since, in the non-selected bit line BL2, no channel is formed in the interface of the silicon thin film (active region), the potential of the bit line BL2 is not transferred to the memory cell of the word line WL1 to which a positive high voltage is applied, and the word line is set in a floating state. Therefore, even though 20V is applied to the word line WL1 of the selected memory cell, the potentials of the floating gate electrode and active region are raised by capacitance coupling, and no charges are transmitted to/received from the floating gate.

Figure 18B:
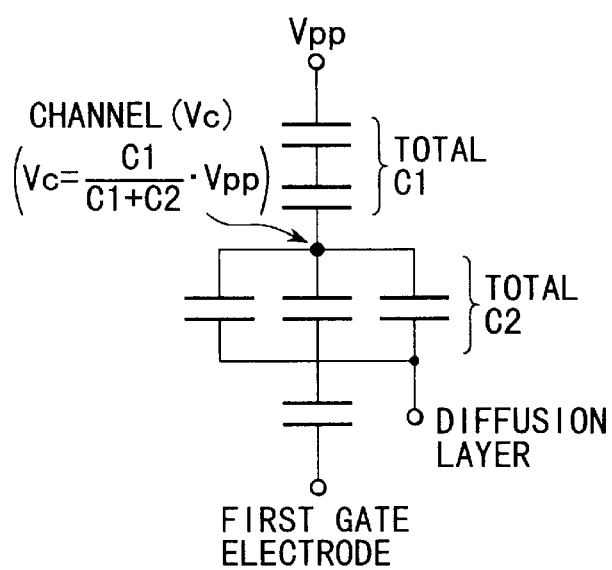
FIG. 18B is a circuit diagram schematically showing the potential of an active region of the NAND type flash EEPROM.
Figure 18C:
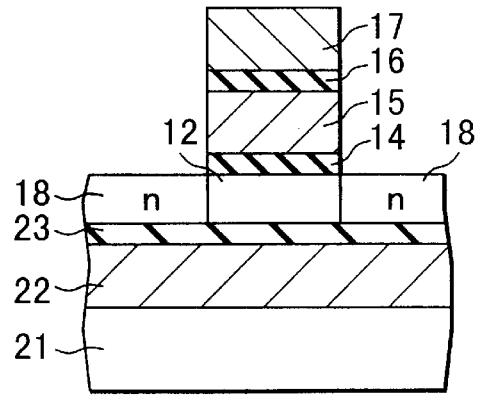
FIG. 18C is a cross-sectional view of each of memory cells constituting the NAND type flash EEPROM.

FIG. 18B is a circuit diagram schematically showing the potential of the active region in a memory cell connected to the non-selected bit line BL2. FIG. 18C is a cross-sectional view of the memory cell. The potential is C1(C1+C2) times as high as voltage Vpp of the control gate electrode by capacitance C1 formed by the control gate electrode and floating gate electrode and capacitance C2 formed by the active region. If capacitance C2 is considerably smaller than capacitance C1, the potential of the active region becomes almost equal to the control gate potential, no writing error occurs since a high electric field is not applied to the second gate insulation film 14. The capacitance C2 is a sum of junction capacitance between the diffuison layer and active region and channel capacitance between the gate electrodes.

Since, in the SOI structure, the active region is very thin, the area thereof contacting the diffusion layer is decreased and so is the junction capacitance between them. Since, furthermore, the entire active region is depleted by voltage Vpp of the control gate electrode, the channel capacitance between the gate electrodes is very small. Therefore, the potential of the active region is sufficiently raised.

In the nonvolatile semiconductor memory device of the fourth embodiment, as described above, the voltage applied to a non-selected bit line in the write mode can be lowered and thus the highest voltage applied to the bit line is about 1V in the read mode, with the result that a transistor constituting a sense amplifier can be miniaturized. Consequently, miniaturization of a memory chip on which a nonvolatile semiconductor memory device is formed can be expected, as can be a large capacity of the nonvolatile semiconductor memory device.

In the fourth embodiment described above, the NAND type flash EEPROM is formed on the SOI substrate, the element regions (active regions) are patterned like islands, and a trench between the element regions is filled with insulating material. In other words, the elements in the row direction are completely separated from each other by the insulating material, so that an interval between the elements in the row direction (the lines extending in the column direction) can be set as small as possible by lithography. Thus, a NAND type flash EEPROM, which is improved in element isolation and reduced in parasitic resistance and parasitic capacitance and which is capable of miniaturization and high-degree of integration, can be provided (first effect).

As described above, it is desirable that the block batch erase operation can be achieved in which data of a plurality of memory cells in a block are erased at once. Thus, in the fourth embodiment, the island-like first gate electrodes 22 are formed on one side of the active region (silicon thin film) which is opposite to the other side thereof on which the floating gate is formed. Since a channel can be formed in the interface of the active region on the insulation film on the first gate electrode 22, the potentials of the bit lines can be transferred to the channels of all the memory cells. In the fourth embodiment, therefore, the block batch erasure, which is one feature of the flash EEPROM, can be achieved, while creating the first effect (feature due to SOI).

Furthermore, as described above, the voltage applied to a non-selected bit line in the write mode can be lowered and thus the highest voltage applied to the bit line is about 1V in the read mode, with the result that a transistor constituting a sense amplifier can be miniaturized. Consequently, a NAND flash EEPROM capable of miniaturization and high-degree of integration can be provided.

A NAND type flash EEPROM according to a fifth embodiment of the present invention will now be described. This EEPROM is capable of block batch erasure and miniaturization and high degree of integration.

Figure 19A:
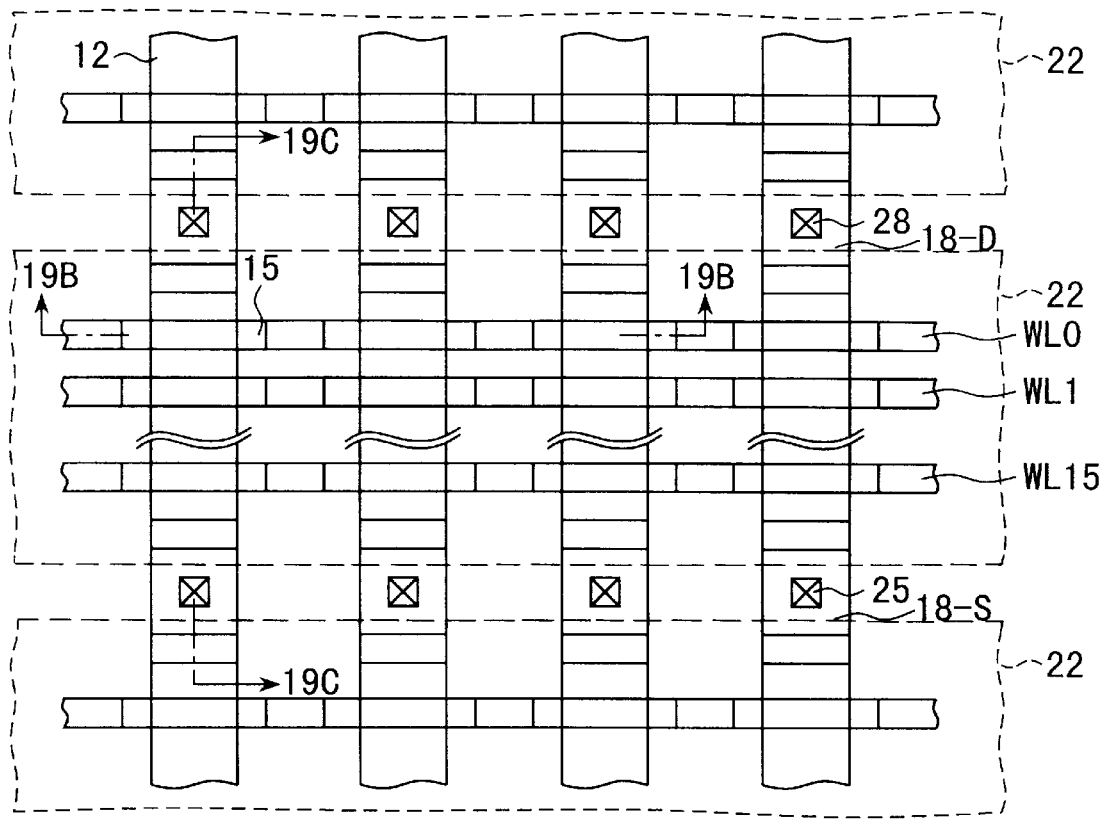
FIG. 19A is a layout view of a NAND type flash EEPROM according to a fifth embodiment of the present invention.
Figure 19B:
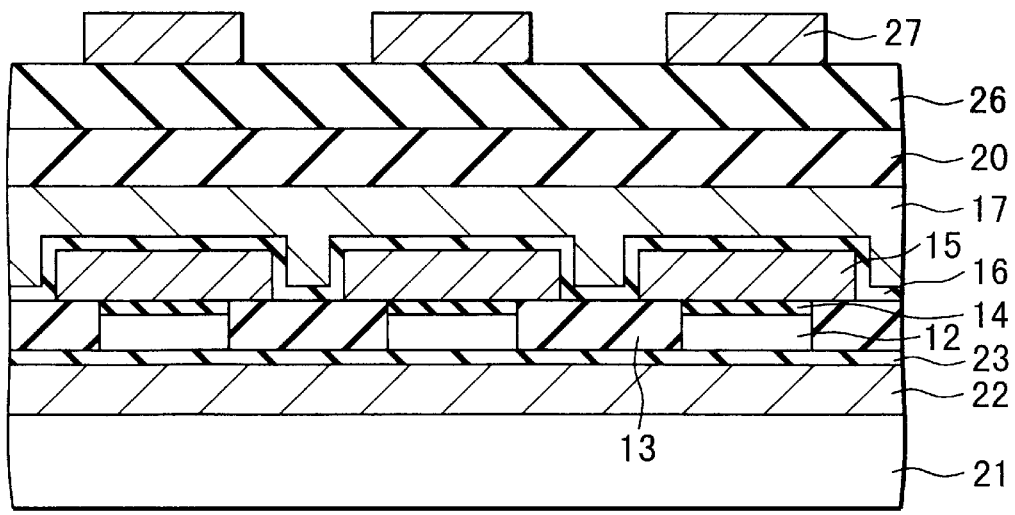
FIG. 19B is a cross-sectional view taken along line 19B—19B of FIG. 19A.
Figure 19C:
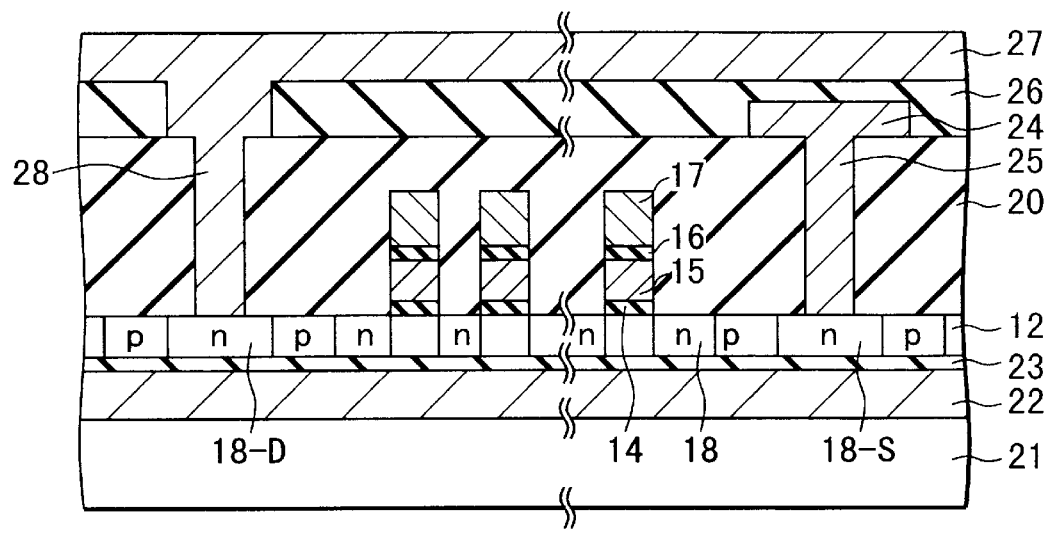
FIG. 19C is a cross-sectional view taken along line 19C—19C of FIG. 19A.
Figure 19D:
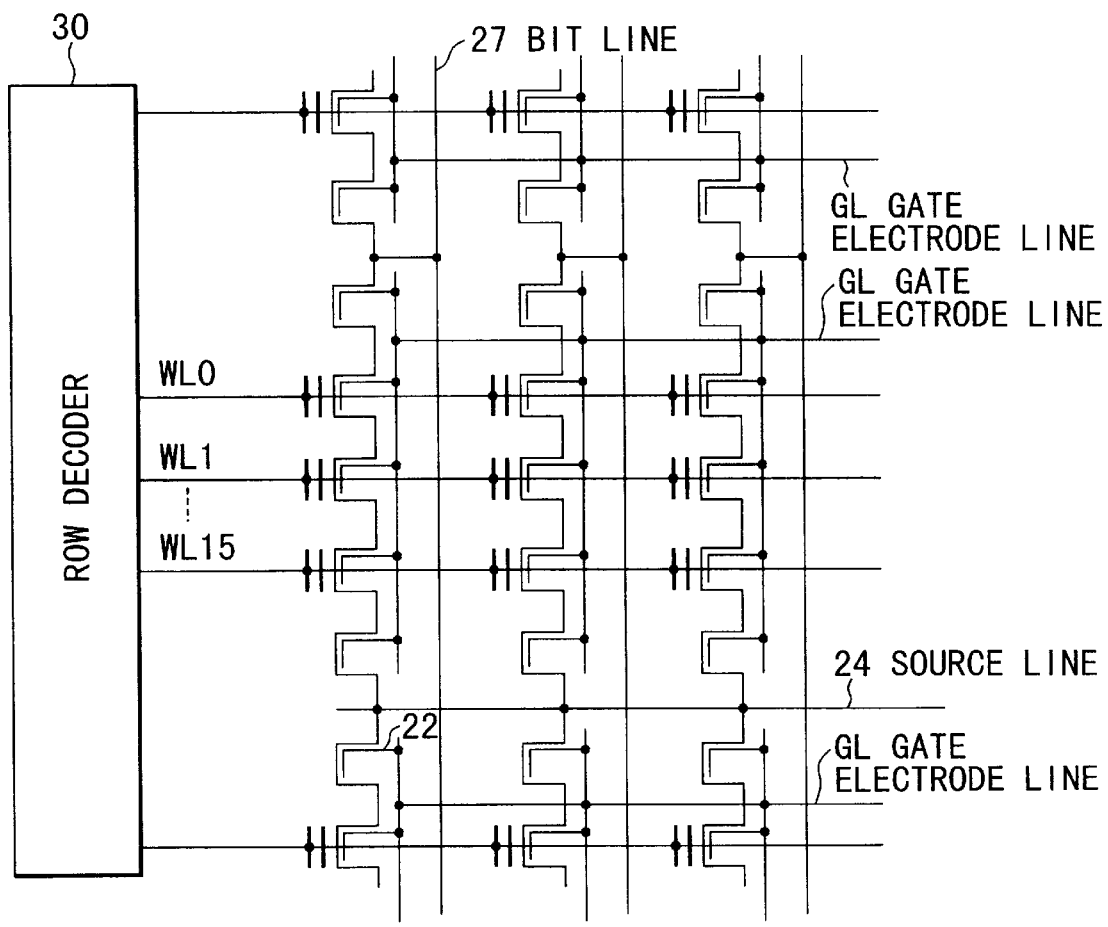
FIG. 19D is an equivalent circuit diagram of a NAND type flash EEPROM according to the fifth embodiment of the present invention.

FIG. 19A is a layout plan view of the NAND type flash EEPROM of the fifth embodiment of the present invention. FIG. 19B is a cross-sectional view taken along line 19B—19B of FIG. 19A, and FIG. 19C is a cross-sectional view taken along line 19C—19C of FIG. 19A. FIG. 19D is an equivalent circuit diagram of the NAND type flash EEPROM.

The NAND type flash EEPROM is constituted as shown in FIGS. 19A to 19C. Plate-shaped first gate electrodes 22 are formed on an insulative substrate 21 and isolated for each NAND string group (block). A space between the isolated first gate electrodes 22 is filled with insulating material 29. First gate insulation films 23 are formed on the respective first gate electrodes 22, and silicon thin films (active regions) 12 are formed on the first gate insulation films 23. The films 12 are obtained by single-crystallization of amorphous silicon or polysilicon. The technique of forming the silicon thin films 12 on the insulation films (first gate insulation films 23) is called SOI (silicon on insulator).

The silicon thin films 12 are formed like islands in the column direction on the first gate insulation films 23 and each used as an active layer. A space between the island-like silicon thin films 12 is filled with insulating material (e.g., silicon oxide film) 13 serving to isolate the elements.

In the fifth embodiment, after the silicon thin films 12 are patterned like islands by lithography, a space between the films 12 is filled with the insulating material 13, thereby to completely isolate adjacent elements in the row direction. In principle, the width of the insulating material 13 (interval between the elements) in the row direction can be set to the minimum which depends upon the lithography and etching.

In the silicon thin films 12, p-type impurities are introduced. As illustrated in FIG. 19A, an n-type source diffusion layer 18-S is formed in part of the silicon thin films 12, while an n-type drain diffusion layer 18-D is formed in another part thereof. Between the source and drain diffusion layers 18-S and 18-D, a NAND string constituted of, e.g., 16 memory cell transistors connected in series is formed. The first gate electrodes 22 are formed for each block so as to include the NAND string in a block which is a unit of erasure.

As illustrated in FIG. 19C, each of the memory cell transistors is constituted of the first gate electrode 22, first gate insulation film 23, silicon thin film (active region) 12, second gate insulation film (tunnel oxide film) 14, floating gate electrode (charge storing layer) 15, third gate insulation film (e.g., ONO film) 16, a control gate electrode 17, and n-type diffusion layer 18.

The second gate insulation film (tunnel oxide film) 14 is formed on the channel region of each memory cell transistor, and the floating gate electrode 15 is formed on the film 14. The third gate insulation film 16 is formed on the electrode 15, and the control gate electrode 17 is formed on the film 16. The n-type diffusion layer 18, which serves as a source or a drain, is formed in the silicon thin film 12 between the control gate electrodes 17 of the memory cell transistors. The side edge of the floating gate electrode 15 in the channel length direction is aligned with that of the control gate electrode 17 since the electrode 15 is etched in self-alignment with the electrode 17.

An interlayer insulation film 20 is formed on the entire surface of the substrate including the control gate electrode 17. A source line 24 is formed on the film 20. A source line contact portion 25 for connecting the source line 24 and source diffusion layer 18-S is formed in a contact hole provided in the interlayer insulation film 20. An interlayer insulation film 26 is formed on the entire surface of the film 20 including the source line 24. A bit line 27 is formed on the interlayer insulation film 26. A bit line contact portion 28 for connecting the bit line 27 and the drain diffusion layer 18-D is formed in a contact hole provided in the interlayer insulation films 20 and 26.

FIG. 19D illustrates part of an equivalent circuit of the EEPROM so constituted. The word lines WL0 to WL15 of the memory cells are connected to a row decoder 30. The source line 24 is connected to the source of the NAND string of memory cells connected in series, and the bit line 27 is connected to the drain thereof. The first gate electrodes 22 are connected to a gate electrode line GL 1 for each block.

As described above, no gate electrodes are formed between the memory cell and bit line contact or source line contact but only the active regions are formed between them. However, the inverted threshold voltage of the interface of the active region alongside the first gate electrodes 22 set lower than that in the memory cells. In the fifth embodiment, the inverted threshold voltage of the active regions between the memory cell and bit line contact or source line contact is set to −0.5V. However, the inverted threshold voltage can be varied when the need arises.

An operation of the NAND type flash EEPROM according to the fifth embodiment of the present invention will now be described.

Figures 20A, 20B:
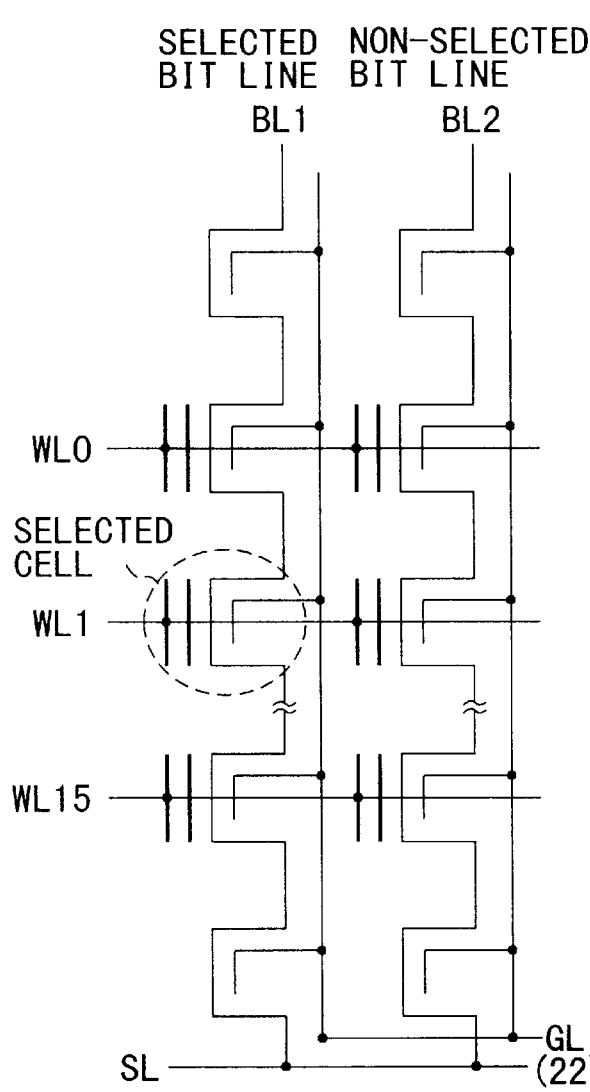
FIG. 20A is a circuit diagram of a NAND string and a select gate transistor constituting a NAND type flash EEPROM according to the fifth embodiment of the present invention.
FIG. 20B is a diagram showing a relationship in potential in the erase, write and read modes of the NAND type flash EEPROM according to the fourth embodiment of the present invention.

FIG. 20A is a circuit diagram of a NAND string and a select gate transistor constituting the NAND type flash EEPROM. FIG. 20B is a diagram showing the relationship in potential in the erase, write and read modes of the EEPROM.

First an erase operation will be described.

In the block batch erasure, as in the third embodiment, the following voltages are applied to the respective lines. A negative high voltage of, e.g., −20V is applied to all the word lines WL0 to WL15 of memory cells in a selected block, while the word lines of memory cells in a non-selected block are set in a floating state or at a low voltage of, e.g., 0V. A low voltage of, e.g., 0V is applied to the bit lines BL1, BL2, . . . and source line SL in the block. A positive intermediate voltage of, e.g., 1V is applied to the gate electrode line GL connected to the first gate electrodes 22. The block batch erase operation can thus be performed.

The positive intermediate voltage applied to the first gate electrode 22 (gate electrode line GL) can be varied when the need arises. However, it needs to be higher than the inverted threshold voltage of the active regions of the memory cells and those between the memory cell and the bit line contact portion.

Secondly a write operation will be described.

In the write operation, the following voltages are applied to the respective lines. A positive high voltage of, e.g., 20V is applied to word line WL1 of a selected memory cell, and 0V is applied to source line SL and selected bit line BL1 thereof.

In order to transfer the potential of the bit line BL1 to the channel of the selected memory cell, a non-selected memory cell connected to the bit line BL1 needs to be turned on. Thus, a positive intermediate voltage of, e.g., 10V is applied to word lines WL0 and WL2 to WL15 of the non-selected memory cell.

In a non-selected memory cell located at the intersection of the non-selected bit line BL2 and the word line WL1 to which 20V is applied, an error in writing has to be prevented. If the channel potential of a non-selected memory cell is increased to about 8V, the error can be prevented. Consequently, 8V is applied to the non-selected bit line BL2 and transferred to the non-selected memory cell. Moreover, a voltage of, e.g., 0V is applied to the first gate electrode 22 (gate electrode line GL).

Since, as described above, an inverted electronic channel is formed in the active region of the selected memory cell, electrons are injected from the channel to a floating gate electrode 15. As a result, the threshold voltage of the selected memory cell becomes higher than the reference potential.

Finally a read operation will be described.

In the read operation, the following voltages are applied to the respective lines. For example, 1V is applied to a selected bit line BL1 and a non-selected bit line BL2. A low voltage of, e.g., 0V is applied to a selected word line WL1. An intermediate voltage of, e.g., 3V is applied to non-selected word lines WL0 and WL2 to WL15 other than the selected word line WL1. The non-selected memory cells of the non-selected word lines WL0 and WL2 to WL15 are turned on. A voltage of, e.g., 0V is applied to the source line SL and first gate electrode 22 (gate electrode line GL).

In the read mode, 0V is applied to the word line WL1 of a selected memory cell to determine whether the threshold voltage is higher than 0V or not. If the selected memory cell is in an erase state, the memory cell is turned on to cause a channel current to flow; therefore, it is understood that the threshold voltage is lower than 0V. On the other hand, if the selected memory cell is in a write state, the memory cell is not turned on and no channel current flows; thus, it is understood that the threshold voltage is higher than 0V.

In the nonvolatile semiconductor memory device of the fifth embodiment, as described above, no select gate transistors are required, so that the area of the memory cell array can be made smaller than that in the third embodiment. Consequently, miniaturization of a memory chip on which the nonvolatile semiconductor memory device is formed can be expected, as can be a large capacity of the nonvolatile semiconductor memory device.

As described above, according to the fifth embodiment, the NAND type flash EEPROM is formed on the SOI substrate, the element regions (active regions) are patterned like islands, and a trench between the element regions is filled with insulating material. In other words, the elements in the row direction are completely separated from each other by the insulating material, so that an interval between the elements in the row direction (the lines extending in the column direction) can be set as small as possible by lithography. Thus, a NAND type flash EEPROM, which is improved in element isolation and reduced in parasitic resistance and parasitic capacitance and which is capable of miniaturization and high-degree of integration, can be provided (first effect).

As described above, it is desirable that the block batch erase operation can be achieved in which data of a plurality of memory cells in a block are erased at once. Thus, in the fourth embodiment, the plate-like first gate electrodes 22, which are separated for each NAND string group (block), is formed on one side of the active region (silicon thin film) which is opposite to the other side thereof on which the floating gate is formed. Since a channel can be formed in the interface of the active region on the insulation film on the first gate electrode 22, the potentials of the bit lines can be transferred to the channels of all the memory cells. In the fifth embodiment, therefore, the block batch erasure, which is one feature of the flash EEPROM, can be achieved, while creating the first effect (feature due to SOI).

Since, as described above, no select gate transistors are required, the area of the memory cell array can be made smaller than that in the third embodiment. Consequently, a NAND type flash EEPROM capable of miniaturization and high-degree of integration can be provided.

In the foregoing embodiments of the present invention, a peripheral circuit (MOS transistor) for driving a memory cell can also be formed on the SOI region. In an n-channel MOS transistor used in a CMOS circuit, a p-type active region and an n-type diffusion layer are employed, as in the select gate transistor. In a p-channel MOS transistor used in a CMOS circuit, an n-type active region and a p-type diffusion layer are used. Furthermore, in each transistor, a threshold voltage can be selected in accordance with a desired set value.

The memory cell transistors can be formed on a bonded SOI substrate or on an SIMOX substrate. They can also be formed on an epitaxial layer on an insulative substrate by solid phase growth. The materials for the active region can be polysilicon or amorphous silicon as well as monocrystalline silicon. The materials other than the silicon type can be used for the active region.

The interlayer insulation film formed on an element such as the foregoing memory cell transistor and select gate transistor can be used as insulating material having an SOI structure, and an element can be formed on the insulating material to achieve three-dimensional integration. Otherwise, the above memory cell transistor and select gate transistor can be formed on a transparent insulative substrate such as a glass substrate, and they can be formed on a chip together with a display device and the like.

The present invention is not limited to the above-described embodiments. Various changes and modifications can be made without departing from the scope of the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a NAND string constituted of a plurality of memory cell transistors connected in series, each of the memory cell transistors having:
      a semiconductor layer formed on an insulation layer and isolated by an element isolation insulation layer;
      a gate insulation layer formed on the semiconductor layer;
      a charge storing layer formed on the gate insulation layer; and
      a control gate layer formed on the charge storing layer with an insulation layer arranged therebetween;
   a bit line connected to a drain side of the NAND string; and
   a source line connected to a source side of the NAND string,
   wherein a first potential is applied to at least one of the bit line and the source line, and one of a second potential, which is higher than the first potential, and a third potential, which is lower than the first potential, is applied to the control gate layer of each of the memory cell transistors, thereby to transfer charges between a channel and the charge storing layer of each of the memory cell transistors.

2. The nonvolatile semiconductor memory device according to claim 1, wherein the channel of each of the memory cell transistors is constituted of at least two regions having different threshold voltages in a gate length direction, one of the regions having a highest threshold voltage being arranged closer to the source side than another of the regions having a lowest threshold voltage.

3. The nonvolatile semiconductor memory device according to claim 2, wherein a conductivity type of a diffusion layer constituting a drain and a source of each of the memory cell transistors is identical with that of the semiconductor layer.

4. The nonvolatile semiconductor memory device according to claim 3, wherein the semiconductor layer has an impurity concentration of $1 \times 10^{12}$ cm$^{-3}$ or lower.

5. The nonvolatile semiconductor memory device according to claim 1, wherein a select gate transistor is provided at least one of both ends of the NAND string, and a conductivity type of a diffusion layer constituting a drain and a source of the select gate transistor is different from that of the semiconductor layer.

6. The nonvolatile semiconductor memory device according to claim 1, wherein the first potential is a ground potential, the second potential is a positive potential, and the third potential is a negative potential.

7. The nonvolatile semiconductor memory device according to claim 6, wherein a fourth potential between the second potential and the third potential is applied to the control gate electrode in a data read mode.

8. A nonvolatile semiconductor memory device comprising a memory cell transistor in which a cell current flows between a source diffusion layer and drain diffusion layer when a gate voltage is applied to a control gate layer, said memory cell transistor having:

a semiconductor layer formed on an insulation layer and isolated by an element isolation insulation layer; and a gate insulation layer formed on the semiconductor layer;

a charge storing layer formed on the gate insulation layer; and a control gate layer formed on the charge storing layer with an insulation layer arranged therebetween, wherein an amount of cell current that flows when the gate voltage falls within one of a first voltage region and a second voltage region is $10^4$ times or more as much as an amount of cell current that flows when the gate voltage matches with a reference voltage, where the first voltage region indicates a region in which a voltage is higher than a first voltage that is predetermined to be higher than the reference voltage and the second voltage region indicates a region in which a voltage is lower than a second voltage that is predetermined to be lower than the reference voltage.

9. The nonvolatile semiconductor memory device according to claim 8, wherein a conductivity type of each of the drain diffusion layer and the source diffusion layer of the memory cell transistor is identical with that of the semiconductor layer.

10. The nonvolatile semiconductor memory device according to claim 9, wherein the semiconductor layer has an impurity concentration of $1\times10^{12}$ $cm^{-3}$ or lower.

11. The nonvolatile semiconductor memory device according to claim 9, wherein the memory cell transistor has a channel which is constituted of at least two regions having different threshold voltages in a gate length direction.

12. The nonvolatile semiconductor memory device according to claim 11, wherein said at least two regions include a first region and a second region, the first region has a threshold voltage which is higher than that of the second region, and the first region is arranged alongside the source diffusion layer and the second region is arranged alongside the drain diffusion layer.

13. The nonvolatile semiconductor memory device according to claim 11, wherein said at least two regions include a first region, a second region and a third region, the first region has a threshold voltage which is higher than that of each of the second region and the third region, and the first region is interposed between the second region and the third region.

14. The nonvolatile semiconductor memory device according to claim 11, wherein a plurality of memory cell transistors are connected in series to constitute a NAND string, and a potential difference between a highest threshold voltage and a lowest threshold voltage in said at least two regions is greater than a potential difference between a voltage applied to the gate electrode of a selected memory cell transistor of the NAND string in a date read mode and a voltage applied to that of a non-selected memory cell transistor thereof.

15. The nonvolatile semiconductor memory device according to claim 8, wherein the reference voltage is substantially equal to a readout voltage applied to the gate electrode of the selected memory cell transistor in a data read mode when the memory cell transistor is in a write state.

16. The nonvolatile semiconductor memory device according to claim 8, wherein a predetermined voltage in the first voltage region is applied to the gate electrode of the memory cell transistor in a data write mode, and a predetermined voltage in the second voltage region is applied to the gate electrode of the memory cell transistor in a data erase mode.

* * * * *